US012063768B2

(12) United States Patent
Lin et al.

(10) Patent No.: US 12,063,768 B2
(45) Date of Patent: *Aug. 13, 2024

(54) TRANSISTORS WITH MULTIPLE THRESHOLD VOLTAGES

(71) Applicant: Taiwan Semiconductor Manufacturing Company, Ltd., Hsinchu (TW)

(72) Inventors: Shih-Hao Lin, Hsinchu (TW); Kian-Long Lim, Hsinchu (TW); Chia-Hao Pao, Kaohsiung (TW); Chih-Chuan Yang, Hsinchu (TW); Chia-Wei Chen, Hsinchu (TW); Chien-Chih Lin, Taichung (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/182,837

(22) Filed: Mar. 13, 2023

(65) Prior Publication Data
US 2023/0217640 A1   Jul. 6, 2023

Related U.S. Application Data

(63) Continuation of application No. 17/342,154, filed on Jun. 8, 2021, now Pat. No. 11,605,638.
(Continued)

(51) Int. Cl.
*H10B 10/00* (2023.01)
*H01L 29/06* (2006.01)
(Continued)

(52) U.S. Cl.
CPC ....... *H10B 10/125* (2023.02); *H01L 29/0673* (2013.01); *H01L 29/401* (2013.01);
(Continued)

(58) Field of Classification Search
CPC . H10B 10/125; H01L 29/0673; H01L 29/401; H01L 29/42392; H01L 29/775;
(Continued)

(56) References Cited

U.S. PATENT DOCUMENTS 9,818,872 B2   11/2017   Ching
9,887,269 B2   2/2018    Ching
(Continued)

*Primary Examiner* — Changhyun Yi
(74) *Attorney, Agent, or Firm* — HAYNES AND BOONE, LLP

(57) ABSTRACT

Semiconductor structures and methods are provided. A method according to the present disclosure includes forming a first channel member, a second channel member directly over the first channel member, and a third channel member directly over the second channel member, depositing a first metal layer around each of the first channel member, the second channel member, and the third channel member, removing the first metal layer from around the second channel member and the third channel member while the first channel member remains wrapped around by the first metal layer, after the removing of the first metal layer, depositing a second metal layer around the second channel member and the third channel member, removing the second metal layer from around the third channel member, and after the removing of the second metal layer, depositing a third metal layer around the third channel member.

20 Claims, 29 Drawing Sheets

Related U.S. Application Data

(60) Provisional application No. 63/177,532, filed on Apr. 21, 2021.

(51) Int. Cl.
  *H01L 29/40* (2006.01)
  *H01L 29/423* (2006.01)
  *H01L 29/775* (2006.01)
  *H01L 29/786* (2006.01)

(52) U.S. Cl.
  CPC ...... *H01L 29/42392* (2013.01); *H01L 29/775* (2013.01); *H01L 29/78696* (2013.01)

(58) Field of Classification Search
  CPC ........... H01L 29/78696; H01L 29/4958; H01L 27/092; H01L 21/823807; H01L 21/823842; H01L 21/823857
  See application file for complete search history.

(56) References Cited

U.S. PATENT DOCUMENTS

| | | |
|---|---|---|
| 9,899,398 B1 | 2/2018 | Colinge |
| 10,032,627 B2 | 7/2018 | Lee |
| 10,109,721 B2 | 10/2018 | Lin |
| 10,157,799 B2 | 12/2018 | Ching |
| 10,199,502 B2 | 2/2019 | Huang |
| 10,290,546 B2 | 5/2019 | Chiang |
| 10,475,902 B2 | 11/2019 | Lee |
| 11,605,638 B2 * | 3/2023 | Lin ................ H01L 21/823842 |
| 2018/0175036 A1 | 6/2018 | Ching |
| 2021/0028291 A1 | 1/2021 | Park |

* cited by examiner

TRANSISTORS WITH MULTIPLE THRESHOLD VOLTAGES

PRIORITY DATA

The present application is a continuation of U.S. application Ser. No. 17/342,154, filed Jun. 8, 2021, which claims the benefit of U.S. Provisional Application No. 63/177,532, filed Apr. 21, 2021, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

Multi-gate devices, such as MBC transistors, may be implemented in memory devices, such as static random access memory (SRAM) devices. As device dimensions continue to shrink, the nominal supply voltage (Vdd) continues to decrease. The nominal supply voltage (Vdd) should not be lower than the minimum supply voltage or the data retention voltage. Otherwise data retention fault may happen. Therefore, although existing SRAM devices are generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
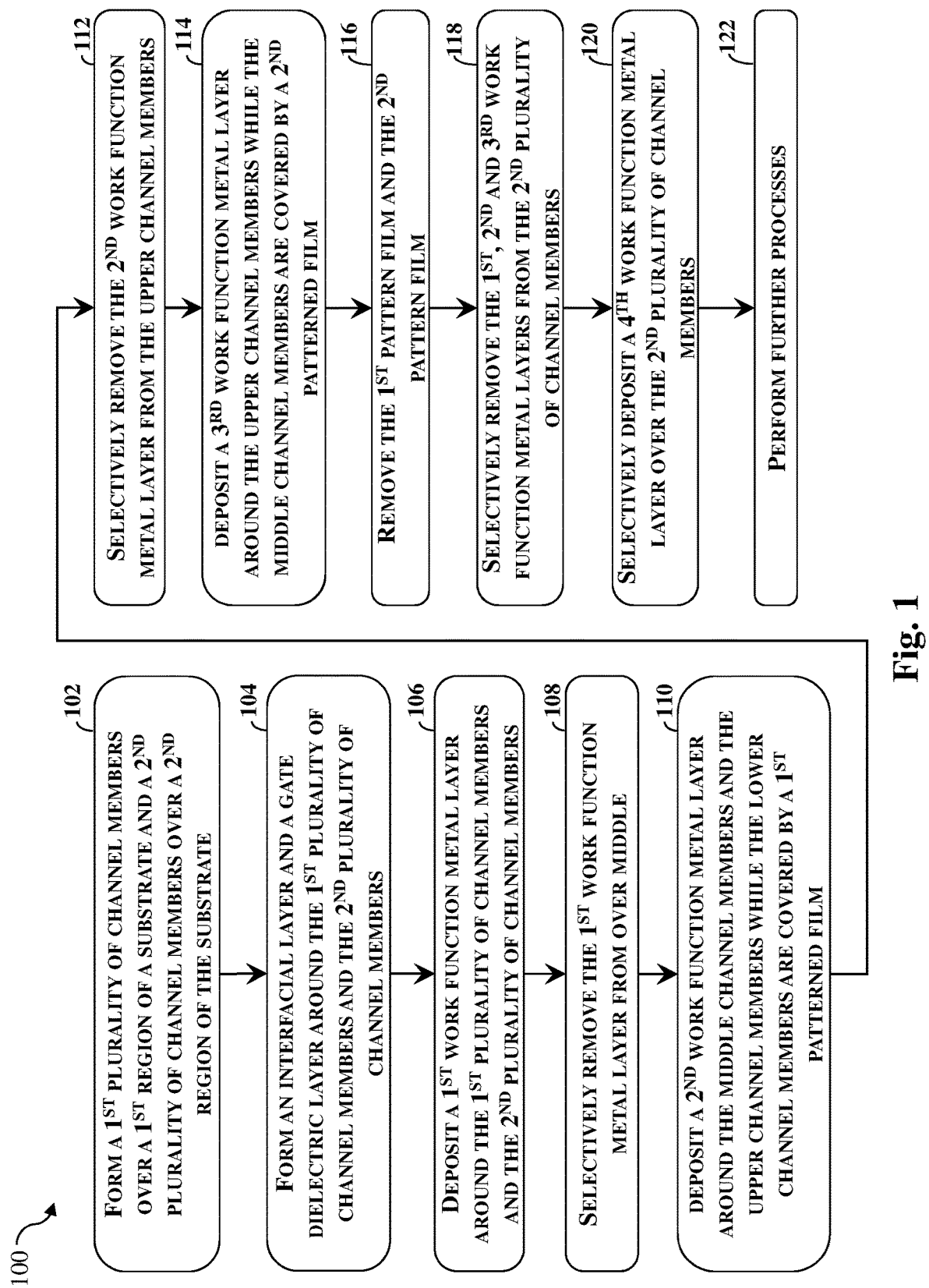
FIG. 1 is a flowchart illustrating a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

As semiconductor devices move toward smaller technology nodes, multi-gate devices, such as MBC transistors, are being used for both memory and logic applications. To achieve faster switching speed for logic applications, it is desirable to operate MBC transistors at lower operating voltages such as 0.6 V or below. Such a low operating voltage may not be desirable for memory application. When the nominal supply voltage (Vdd) of the SRAM devices continue to decrease, the nominal supply voltage may approach or fall below the minimum supply voltage (Vccmin, also known as the data retention voltage (DRV)) for data retention or, causing retention fault or memory loss. In some existing technology, memory device regions and logic device regions are powered by two power circuits, one supplying a lower voltage to the logic device regions and the other supplying a higher voltage to the memory device regions. While having two power circuits remains a valid and effective method to prevent retention fault, the additional power circuit necessarily takes up additional space.

In embodiments of the present disclosure, an MBC transistor in an SRAM device may include a standard threshold voltage (SVt) device, a low threshold voltage (LVt) device, and an ultralow threshold voltage (ULVt) device. As their names suggest, a threshold voltage of the standard threshold voltage (SVt) device is greater than a threshold voltage of the low threshold voltage (LVt) device and the threshold voltage of the low threshold voltage (LVt) device is greater than a threshold voltage of the ultralow threshold voltage (ULVt) device. In one embodiment, the MBC transistor includes a first channel member, a second channel member directly over the first channel member, and a third channel member directly over the second channel member. In some implementations, the first channel member is wrapped around by a first metal layer, the second channel member is wrapped around by a second metal layer, and the third channel member is wrapped around by a third metal layer. The first metal layer, the second metal layer and the third metal layer are different from one another in terms of composition, such as aluminum content. In some other implementations, the first channel member is wrapped around by a first dipole layer of a first thickness, the second channel member is wrapped around by a second dipole layer of a second thickness, and the third channel member is wrapped around by a third dipole layer of a third thickness. The first dipole layer, the second dipole layer and the third dipole layer may include lanthanum oxide. The third thickness is greater than the second thickness and the second thickness is greater than the first thickness. When implemented in an SRAM cell and when the nominal supply voltage (Vdd) is below the data retention voltage of the standard threshold voltage (SVt) device, the memory may still be retained in the low threshold voltage (LVt) device and/or the ultralow threshold voltage (ULVt) device. Because the SRAM cell of the present disclosure may be operated under a lower voltage without retention fault, the memory device region and logic device region may be powered by the same power circuit. It can be seen that embodiments of the present disclosure provide the benefits of good data retention under lower nominal supply voltage, improvement of Vccmin, reduced power consumption, and reduced device area.

The various aspects of the present disclosure will now be described in more detail with reference to the figures. In that regard, FIGS. 1 and 16 are flowcharts illustrating a method 100 and a method 300 of forming a semiconductor device according to embodiments of the present disclosure. Methods 100 and 300 are merely examples and are not intended to limit the present disclosure to what is explicitly illustrated in methods 100 and 300. Additional steps can be provided before, during and after the method 100 or method 300, and some steps described can be replaced, eliminated, or moved around for additional embodiments of methods. Not all steps are described herein in detail for reasons of simplicity. Method 100 is described below in conjunction with FIG. 2-15, which are fragmentary cross-sectional views of a workpiece 200 at different stages of fabrication according to embodiments of the method 100 in FIG. 1. Method 300 is described below in conjunction with FIG. 17-27, which are fragmentary cross-sectional views of a workpiece 200 at different stages of fabrication according to embodiments of the method 300 in FIG. 16. For avoidance of doubts, the X, Y and Z directions in FIGS. 2-15 and 17-27 are perpendicular to one another and are used consistently throughout FIGS. 2-15 and 17-27. Because the workpiece 200 will be fabricated into a semiconductor device or a semiconductor structure, the workpiece 200 may be referred to herein as a semiconductor device 200 or a semiconductor structure 200 as the context requires. Throughout the present disclosure, like reference numerals denote like features unless otherwise expressly excepted.

Figure 2:
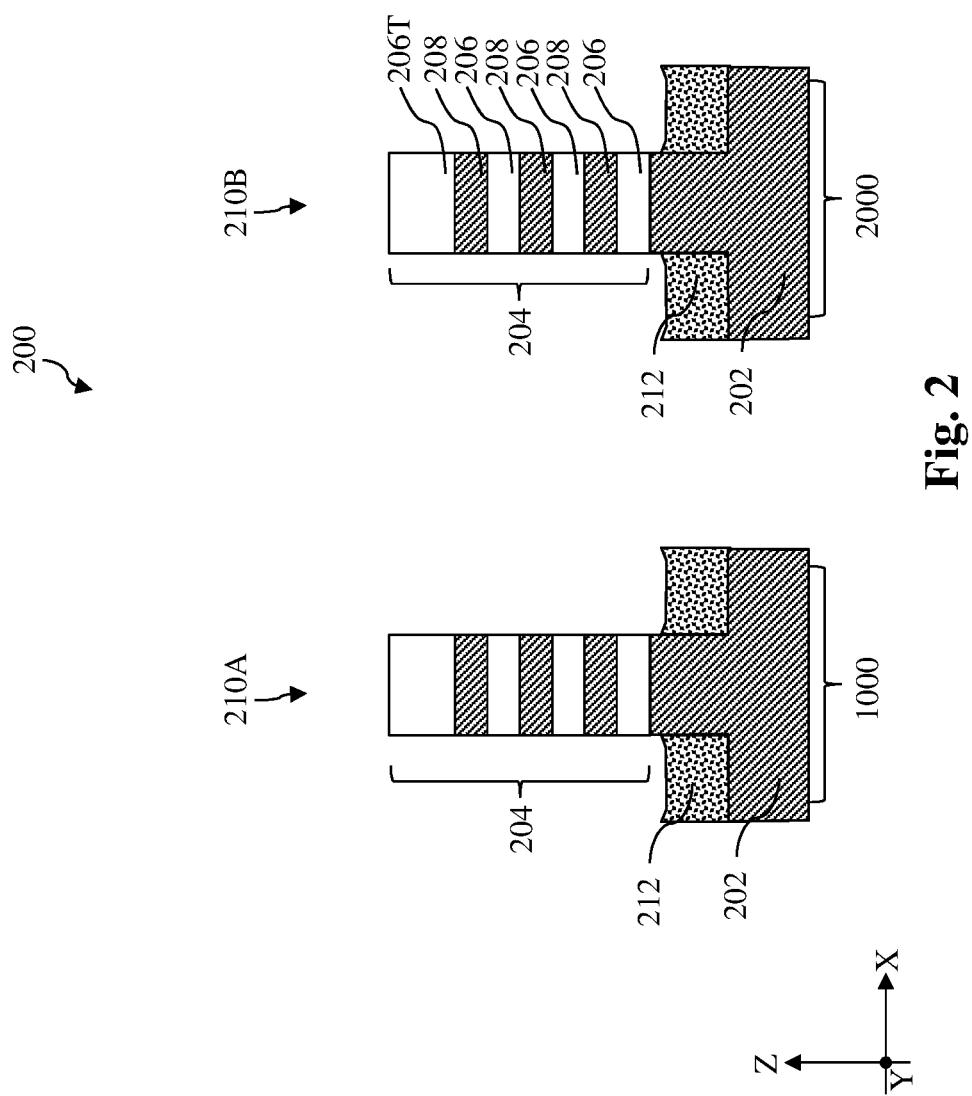
FIGS. 2-15 illustrate fragmentary cross-sectional views of the workpiece at various stages of fabrication in accordance with the method in FIG. 1.
Figure 3:
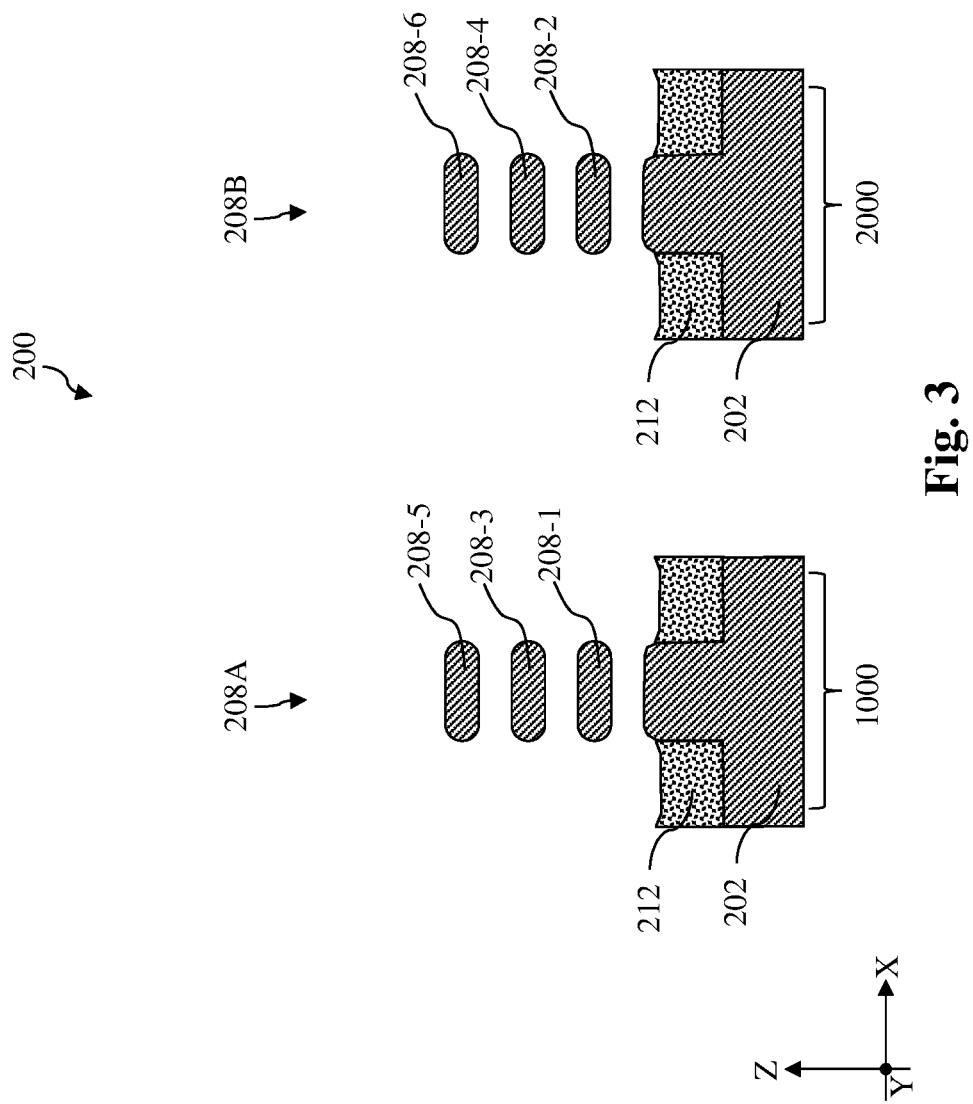

Referring now to FIGS. 1, 2 and 3, the method 100 includes a block 102 where a first plurality of channel members 208A are formed over a first region 1000 and a second plurality of channel members 208B are formed over a second region 2000. To form the first plurality of channel members 208A and the second plurality of channel members 208B, a semiconductor stack 204 is first formed over a first region 1000 and a second region 2000 on a substrate 202 of a workpiece 200. The semiconductor stack 204 may include channel layers 208 interleaved by sacrificial layers 206. Referring to FIG. 2, the semiconductor stack 204 is then patterned to form a first fin-shaped structure 210A over the first region 1000 and a second fin-shaped structure 210B over the second region 2000. As illustrated in FIG. 3, the sacrificial layers 206 in the first fin-shaped structure 210A and the second fin-shaped structure 210B are removed to release the channel layers 208 as the first plurality of channel members 208A in the first region 1000 and the second plurality of channel members 208B in the second region 2000.

In some embodiments, the substrate 202 includes silicon (Si). Alternatively or additionally, substrate 202 includes another elementary semiconductor, such as germanium (Ge); a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 202 includes one or more group III-V materials, one or more group II-IV materials, or combinations thereof. In some implementations, the substrate 202 is a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods. The substrate 202 can include various doped regions configured according to design requirements of semiconductor device 200. P-type doped regions may include p-type dopants, such as boron, indium, other p-type dopant, or combinations thereof. N-type doped regions may include n-type dopants, such as phosphorus, arsenic, other n-type dopant, or combinations thereof. The various doped regions can be formed directly on and/or in substrate 202, for example, providing a p-well structure, an n-well structure, or combinations thereof. An ion implantation process, a diffusion process, and/or other suitable doping process can be performed to form the various doped regions. Referring to FIG. 2, the substrate 202 includes a first region 1000 for formation of n-type MBC transistors and a second region 2000 for formation of p-type MBC transistors. The first region 1000 may include a p-type well and the second region 2000 may include an n-type well.

In the embodiments represented in FIG. 2, the semiconductor stack 204 includes a plurality of channel layers 208 interleaved by a plurality of sacrificial layers 206. The plurality of channel layers 208 are formed of a first semiconductor material and the plurality of sacrificial layers 206 are formed of a second semiconductor material that is different from the first semiconductor material. In some embodiments, the first semiconductor material is or consists essentially of silicon (Si) and the second semiconductor material is or consists essentially of silicon germanium (SiGe). The semiconductor stack 204 may be formed by depositing or epitaxially growing the plurality of channel layers 208 and the plurality of sacrificial layers 206 alternatingly. In some embodiments, the topmost sacrificial layer 206T may be thicker than the other sacrificial layers 206 to protect the channel layers 208 from undesirable damages during fabrication of the semiconductor device 200.

Referring FIG. 2, the semiconductor stack 204 is then patterned into the first fin-shaped structure 210A in the first region 1000 and the second fin-shaped structure 210B in the second region 2000. At block 102, the first fin-shaped structures 210A and the second fin-shaped structures 210B may be patterned by using suitable processes such as photolithography and etching processes. In some embodiments, the fin-shaped structures are formed from the semiconductor stack 204 and a portion of the substrate 202 using dry etch or plasma etch processes. In some other embodiments, the fin structures can be formed by a double-patterning lithography (DPL) process, a quadruple-patterning lithography (QPL) process or a multiple-patterning lithography (MPL) process. Generally, DPL, QPL and MPL processes combine photolithography and self-aligned processes, allowing patterns to be created that have, for example, pitches smaller than what is otherwise obtainable using a single, direct photolithography process. In some implementations, dielectric isolation features 212 are formed among the first fin-shaped structures 210A and the second fin-shaped structures 210B. The dielectric isolation features 212 may also be referred to as shallow trench isolation (STI) features 212. The dielectric isolation features 212 may include silicon oxide, silicon oxynitride, fluorine-doped silicate glass (FSG), a low-k dielectric, combinations thereof, and/or other suitable materials.

In the channel regions of the first fin-shaped structure 210A and the second fin-shaped structure 210B, the sacrificial layers 206 (including the topmost sacrificial layer 206T) are selectively removed to release the channel layers 208 in the first region 1000 into the first plurality of channel members 208A and the channel layers 208 in the second region 2000 into the second plurality of channel members 208B. In an example gate-last process, several intervening processes may take place between the formation of the first fin-shaped structure 210A and the second fin-shaped structure 210B and the release for the first plurality of channel members 208A and the second plurality of channel members 208B. For example, a dummy gate stack may be formed over channel regions of the first fin-shaped structure 210A and the second fin-shaped structure 210B; at least one gate spacer layer may be formed along sidewalls of the dummy gate stack; source/drain regions of the first fin-shaped structure 210A and the second fin-shaped structure 210B are recessed to form source/drain trenches; inner spacer features may be formed between adjacent channel layers 208; source/drain features may be formed over the source/drain trenches; contact etch stop layer (CESL) and an interlayer dielectric layer (ILD) may be formed over the source/drain features; and the dummy gate stack may be removed. FIGS. 2-13 shows cross-sections that pass through the channel regions and do not necessarily show structures formed by these intervening processes.

Reference is still made to FIG. 3. After the removal of the dummy gate stack, the sacrificial layers 206 in the first region 1000 are selectively removed to release the channel layers 208 as the first plurality of channel members 208A and the sacrificial layers 206 in the second region 2000 are selectively removed to release the channel layers 208 as the second plurality of channel members 208B. In some example processes where the channel layers 208 are formed of silicon (Si) and the sacrificial layers 206 are formed of silicon germanium (SiGe), the sacrificial layers 206 may be removed using selective dry etch process or selective wet etch process. The selective dry etch process may include use of one or more fluorine-based etchants, such as fluorine gas or hydrofluorocarbons. The selective wet etching process may include an APM etch (e.g., ammonia hydroxide-hydrogen peroxide-water mixture). In the depicted embodiments, the first plurality of channel members 208A includes a first lower member 208-1, a first middle member 208-3, and a first upper member 208-5 and the second plurality of channel members 208B includes a second lower member 208-2, a second middle member 208-4, and a second upper member 208-6. The first lower member 208-1 and the second lower member 208-2 may be collectively referred to as lower channel members. The first middle member 208-3 and the second middle member 208-4 may be collectively referred to as middle channel members. The first upper member 208-5 and the second upper member 208-6 may be collectively referred to as upper channel members. It is noted while embodiments of the present disclosure are described as including three (3) vertical levels of channel members, the present disclosure is not so limited. Embodiments including more or less vertical levels of the channel members are fully envisioned and may be implemented by increasing the numbers of channel layers 208 and sacrificial layers 206 in the semiconductor stack 204. The middle channel members are disposed over the lower channel members. The upper channel members are disposed over the middle channel members.

Figure 4:
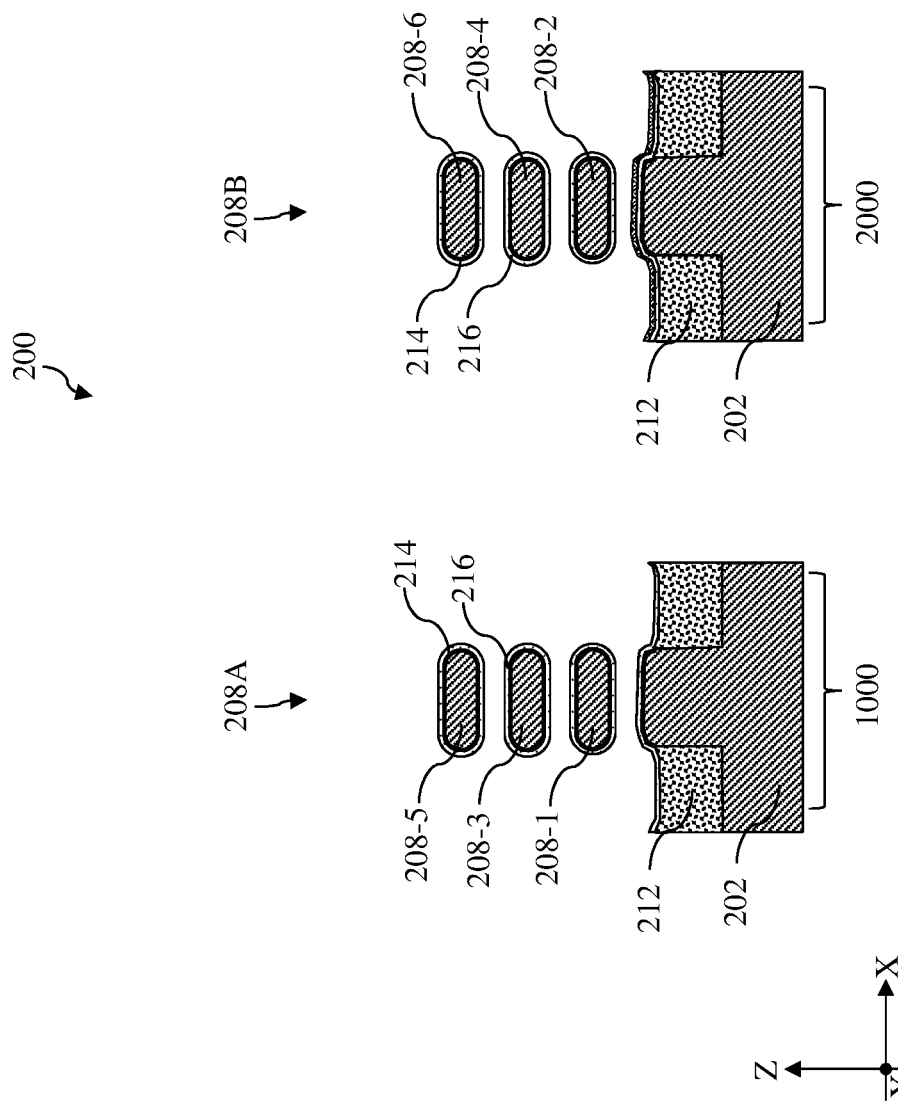

Referring to FIGS. 1 and 4, the method 100 includes a block 104 where an interfacial layer 214 and a gate dielectric layer 216 are formed to wrap around each of the first plurality of channel members 208A and the second plurality of channel members 208B. In some embodiments, the interfacial layer 214 may include silicon oxide or other suitable material. In some embodiments, the interfacial layer 214 may be formed or deposited using a suitable method, such as atomic layer deposition (ALD), chemical vapor deposition (CVD), thermal oxidation, or other suitable method. The interfacial layer 214 serves to control and reduce gate leakage current and improve interfacial adhesion between the gate dielectric layer 216 and the channel members. A gate dielectric layer 216 is deposited over the interfacial layer 214 over the workpiece 200. In some embodiments, the gate dielectric layer 216 is high-k dielectric layer as its dielectric constant is greater than that of silicon dioxide (~3.9). In some implementations, the gate dielectric layer 216 may include titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), aluminum silicon oxide (AlSiO), hafnium tantalum oxide (HfTaO), hafnium titanium oxide (HfTiO), (Ba, Sr)$TiO_3$ (BST), silicon nitride (SiN), silicon oxynitride (SiON), combinations thereof, or other suitable material. Upon conclusion of operations at block 104, each of the first plurality of channel members 208A and the second plurality of channel members 208B is wrapped around by the interfacial layer 214 and the gate dielectric layer 216.

Figure 5:
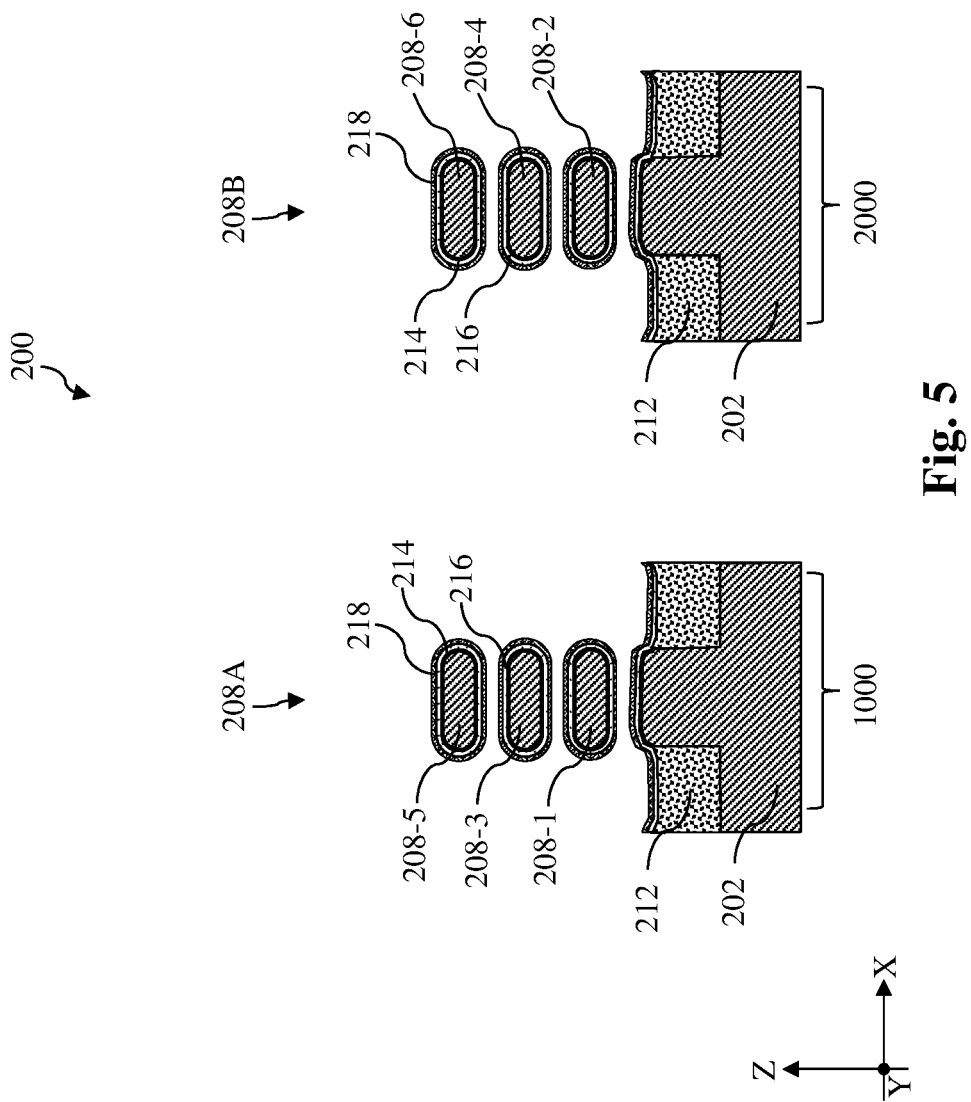

Referring to FIGS. 1 and 5, method 100 includes a block 106 where a first work function metal layer 218 is deposited to wrap around each of the first plurality of channel members 208A and each of the second plurality of channel members 208B. The first work function metal layer 218 is an n-type work function metal layer and may include aluminum (Al). In some embodiments, the first work function metal layer 218 may include aluminum (Al) and titanium (Ti). In some alternative embodiments, the first work function metal layer 218 may include more than two metal species, such as aluminum (Al), titanium (Ti) and nitrogen (N). In one embodiment, when the first work function metal layer 218 includes aluminum (Al) and titanium (Ti), an aluminum contact to titanium (Al/Ti) ratio of the first work function metal layer 218 may be between about 0.3 and 0.4. In some alternative embodiments, the first work function metal layer 218 may include other aluminum-containing material, such as titanium aluminum carbide (TiAlC), tantalum aluminum carbide (TaAlC), or tantalum aluminum silicide (TaSiAl). In some implementations, the first work function metal layer 218 is deposited using atomic layer deposition (ALD), chemical vapor deposition (CVD), or physical vapor deposition (PVD). In some instances, the first work function metal layer 218 may be deposited to a thickness between about 1.5 nm and about 2.5 nm.

Figure 6:
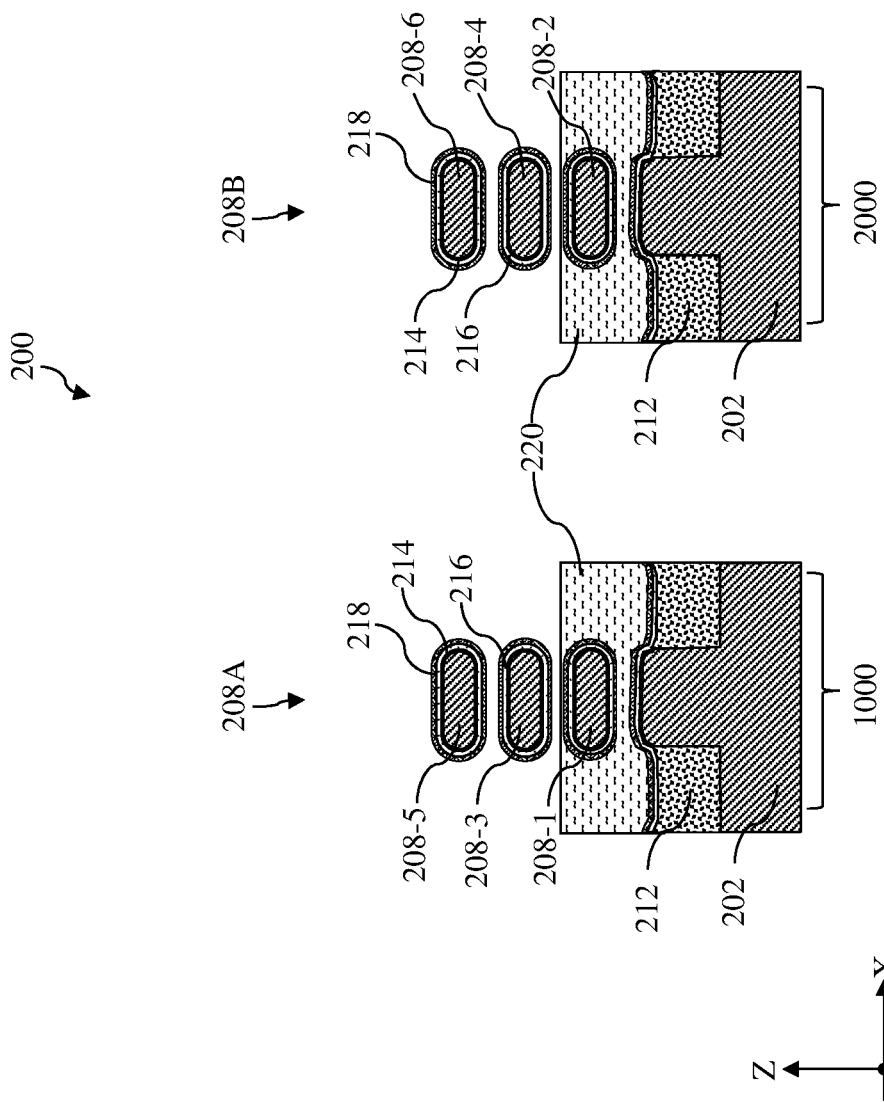
Figure 7:
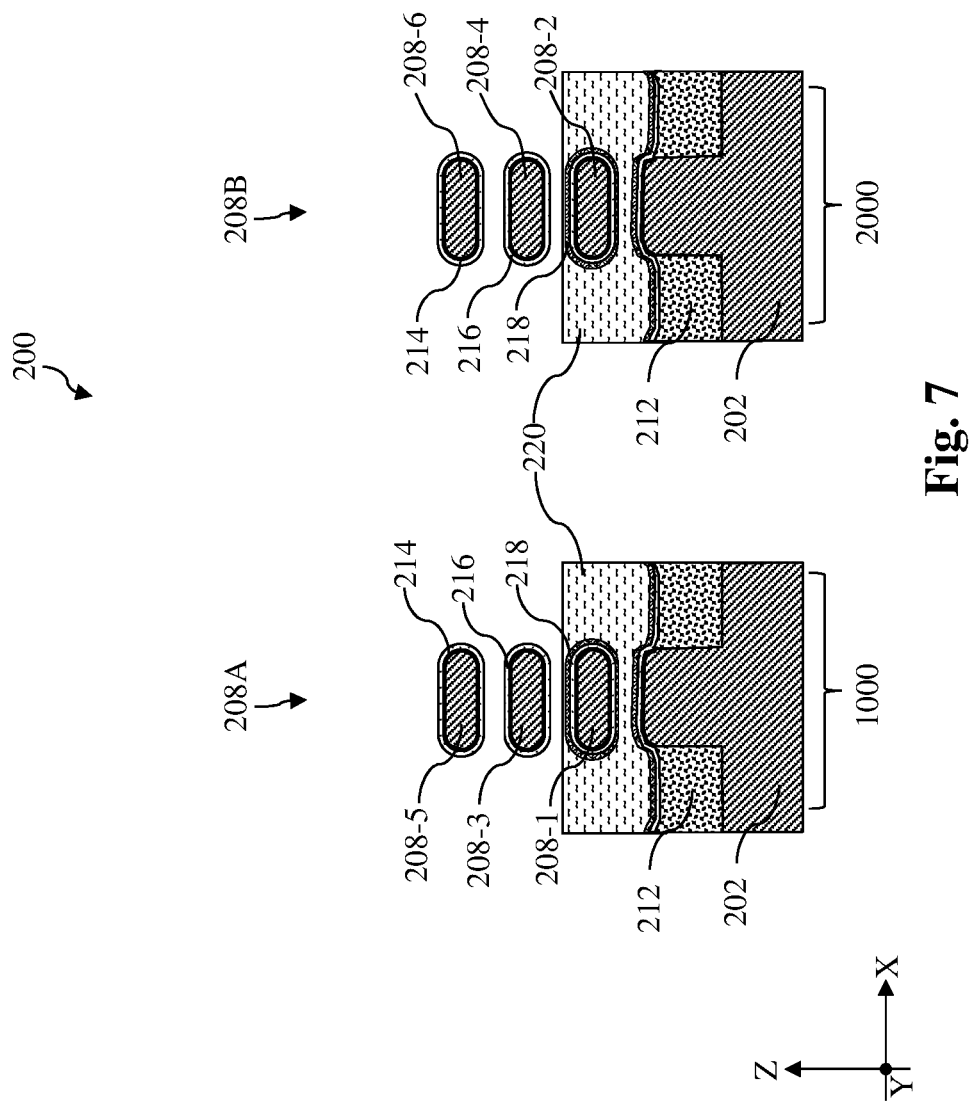

Referring to FIGS. 1, 6 and 7, method 100 includes a block 108 where the first work function metal layer 218 is selectively removed from around the middle channel members and upper channel members while the lower channel members are covered by a first pattern film 220. Operations at block 108 include formation of the first pattern film 220 to cover the lower channel members and expose the middle channel members and upper channel members (shown in FIG. 6) and selective removal of the first work function metal layer 218 around the middle channel members and the upper channel members (shown in FIG. 7). Referring first to FIG. 6, the first pattern film 220 may include a photoresist layer or a bottom antireflective coating (BARC) layer. In some instances, the first pattern film 220 may include silicon, nitrogen, and hydrogen. As shown in FIG. 6, the first pattern film 220 is formed to cover only the lower channel members (including the first lower member 208-1 and the second lower member 208-2) while the middle channel members (including the first middle member 208-3 and the second middle member 208-4) and the upper channel members (including the first upper member 208-5 and the second upper member 208-6) are exposed. In some instances, the first pattern film 220 may be formed by depositing a photoresist layer or a BARC layer using spin-on coating or flowable CVD (FCVD) and then etching back the deposited photoresist layer or BARC to the desired thickness to cover the lower channel members. Referring to FIG. 7, with the first pattern film 220 protecting the first work function metal layer 218 around the lower channel members, the first work function metal layer 218 over the middle channel members and the upper channel members are selectively removed. In some embodiments, the first work function metal layer 218 may be etched using a selective wet etch process or a selective dry etch process. Example wet etch processes may include phosphoric acid ($H_3PO_4$), nitric acid ($HNO_3$), acetic acid ($CH_3COOH$), hydrofluoric acid (HF), or a combination thereof.

Figure 8:
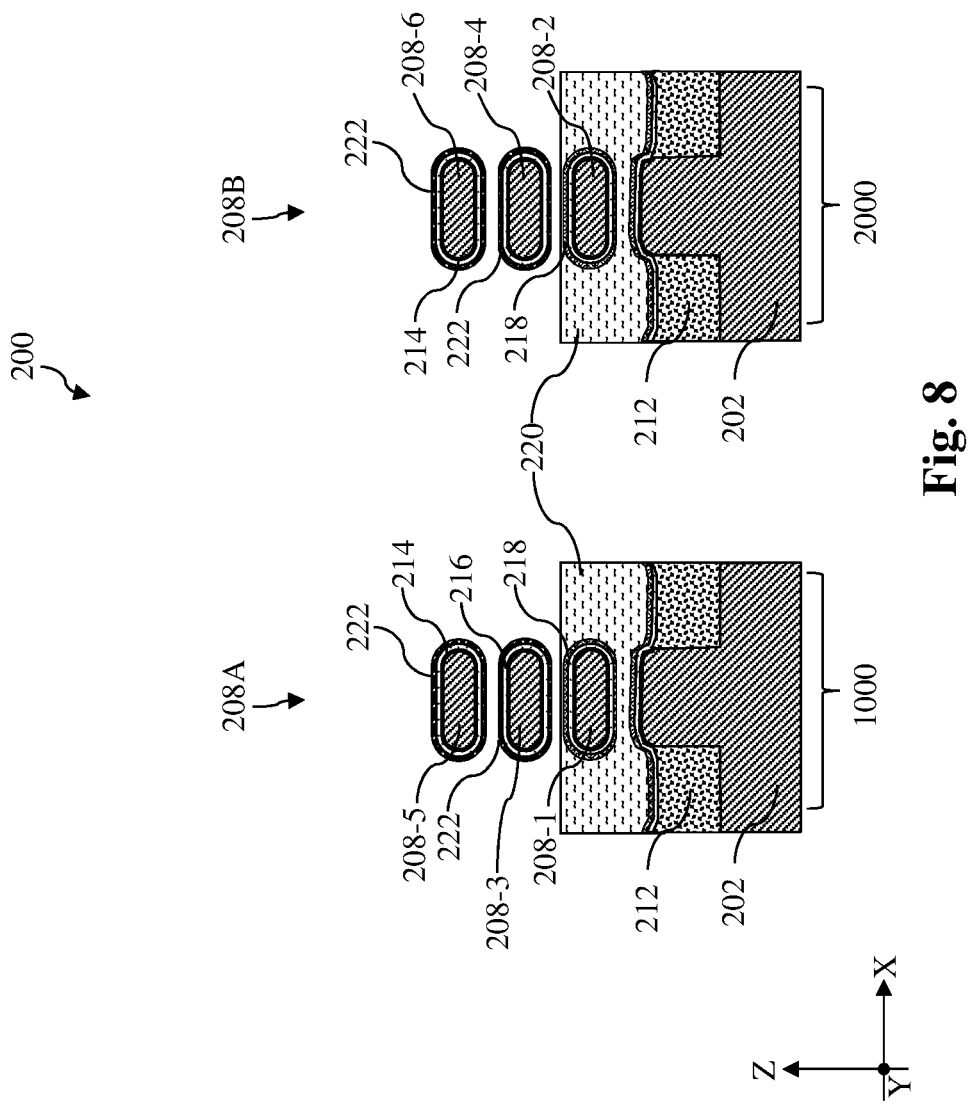

Referring to FIGS. 1 and 8, method 100 includes a block 110 where a second work function metal layer 222 is selectively deposited to wrap around the middle channel members and upper channel members. The second work function metal layer 222 is an n-type work function metal layer and may include aluminum (Al). In some embodiments, the second work function metal layer 222 may include aluminum (Al) and titanium (Ti). In some alternative embodiments, the second work function metal layer 222 may include more than two metal species, such as aluminum (Al), titanium (Ti) and nitrogen (N). The second work function metal layer 222 and the first work function metal layer 218 have different compositions. In one embodiment, the second work function 222 has a greater aluminum content than the first work function metal layer 218. When the second work function metal layer 222 includes aluminum (Al) and titanium (Ti), an aluminum contact to titanium (Al/Ti) ratio of the second work function metal layer 222 may be between about 0.5 and 0.6. In some alternative embodiments, the second work function metal layer 222 may include other aluminum-containing material, such as titanium aluminum carbide (TiAlC), tantalum aluminum carbide (TaAlC), or tantalum aluminum silicide (TaSiAl). In some implementations, the first second function metal layer 222 is deposited using atomic layer deposition (ALD), chemical vapor deposition (CVD), or physical vapor deposition (PVD). In some instances, the second work function metal layer 222 may be deposited to a thickness between about 1.5 nm and about 2.5 nm.

Figure 9:
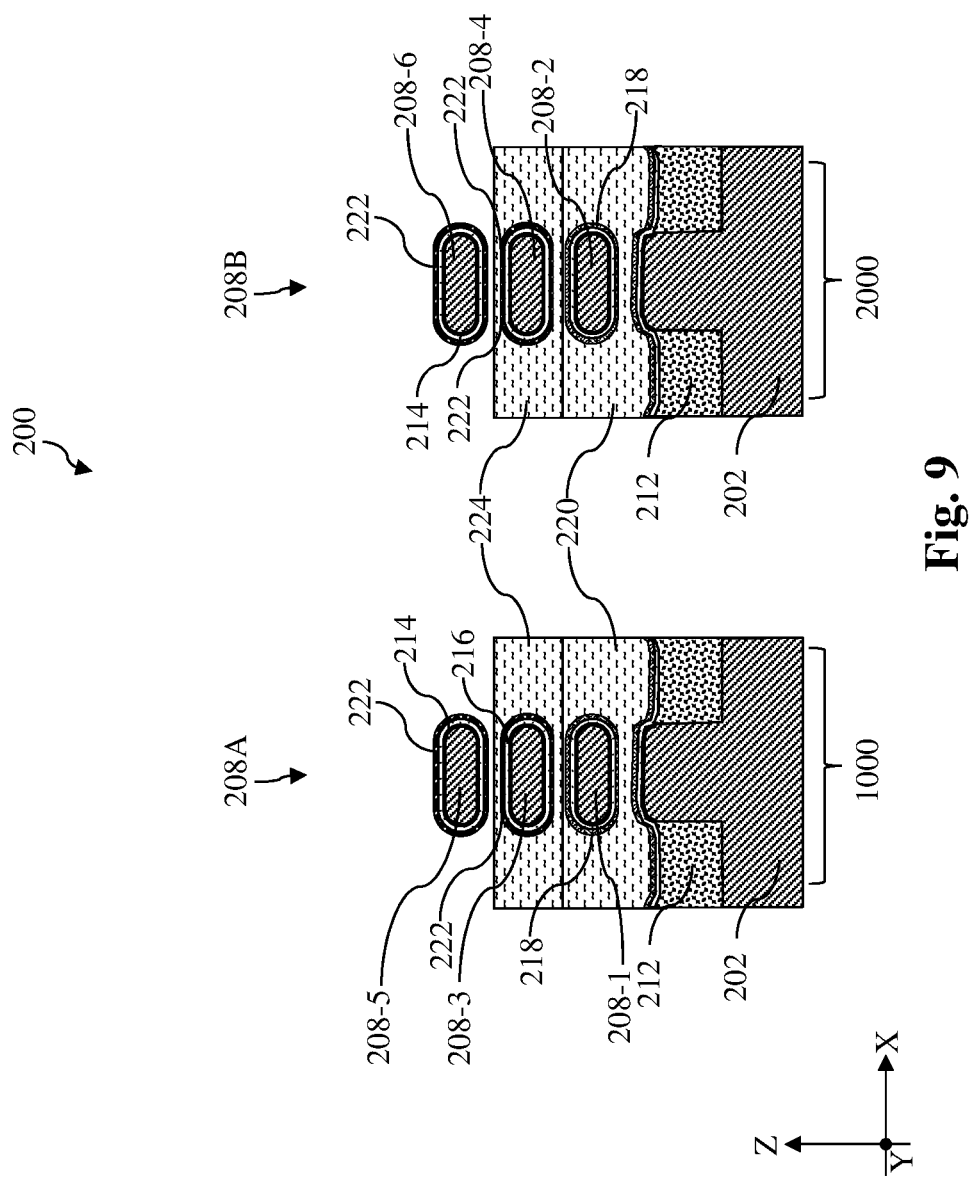
Figure 10:
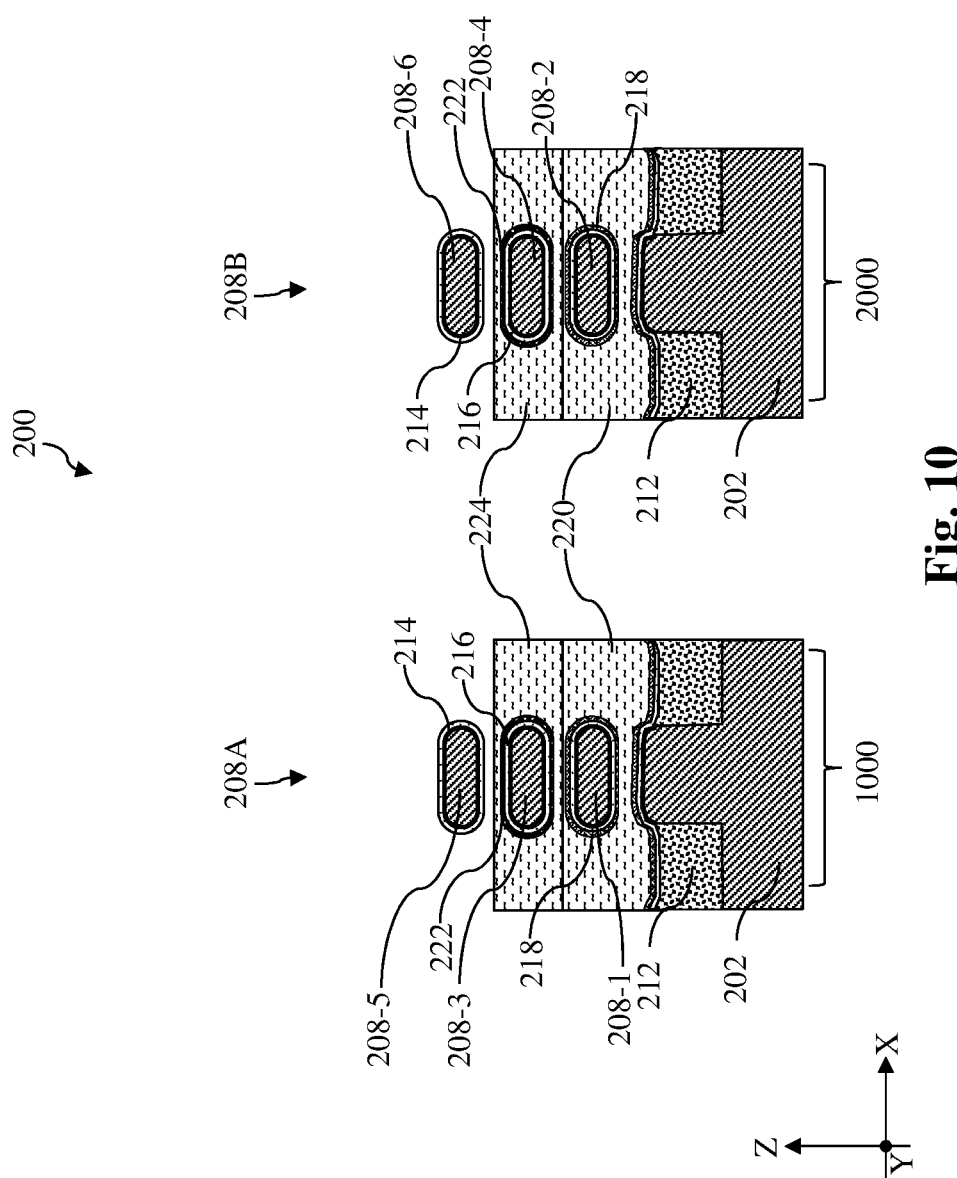

Referring to FIGS. 1, 9 and 10, method 100 includes a block 112 where the second work function metal layer 222 is selectively removed from around the upper channel members while the middle channel members are covered by a second pattern film 224. Operations at block 112 include formation of the second pattern film 224 to cover the middle channel members and expose the upper channel members (shown in FIG. 9) and selective removal of the second work function metal layer 224 around the upper channel members (shown in FIG. 10). It is noted that the first pattern film 220 has not been removed at this point and the lower channel members remain covered by the first pattern film 220. Referring first to FIG. 9, the second pattern film 224 may include a photoresist layer or a bottom antireflective coating (BARC) layer. In some instances, the second pattern film 224 may include silicon, nitrogen, and hydrogen. As shown in FIG. 9, the second pattern film 224 is formed to cover only the middle channel members (including the first middle member 208-3 and the second middle member 208-4) while the upper channel members (including the first upper member 208-5 and the second upper member 208-6) are exposed. In some instances, the second pattern film 224 may be formed by depositing a photoresist layer or a BARC layer using spin-on coating or flowable CVD (FCVD) and then etching back the deposited photoresist layer or BARC to the desired thickness to cover the middle channel members. Referring to FIG. 10, with the second pattern film 224 protecting the second work function metal layer 222 around the middle channel members, the second work function metal layer 222 over the upper channel members are selectively removed. In some embodiments, the second work function metal layer 222 may be etched using a selective wet etch process or a selective dry etch process. Example wet etch processes may include phosphoric acid ($H_3PO_4$), nitric acid ($HNO_3$), acetic acid ($CH_3COOH$), hydrofluoric acid (HF), or a combination thereof.

Figure 11:
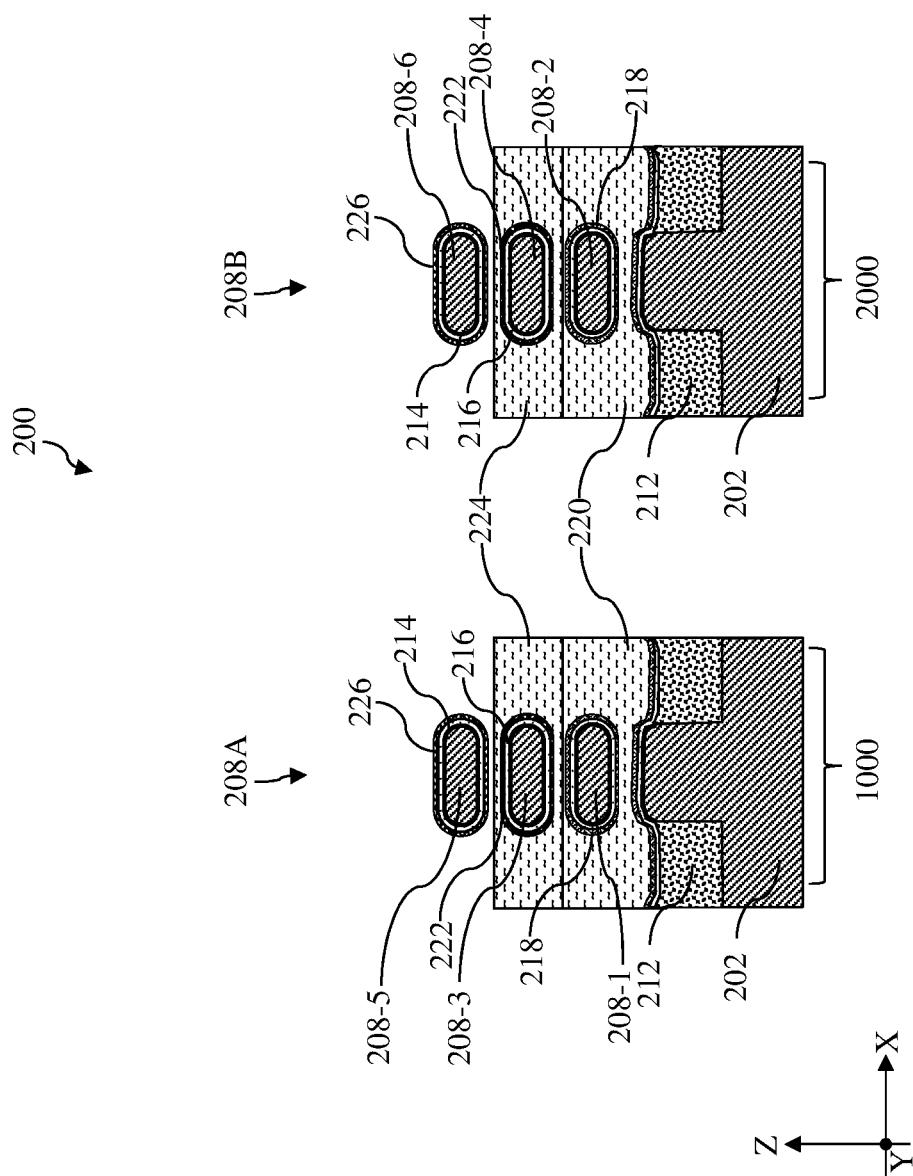

Referring to FIGS. 1 and 11, method 100 includes a block 114 where a third work function metal layer 226 is selectively deposited to wrap around the upper channel members. The third work function metal layer 226 is an n-type work function metal layer and may include aluminum (Al). In some embodiments, the third work function metal layer 226 may include aluminum (Al) and titanium (Ti). In some alternative embodiments, the third work function metal layer 226 may include more than two species, such as aluminum (Al), titanium (Ti) and nitrogen (N). In some alternative embodiments, the third work function metal layer 226 may include other aluminum-containing material, such as titanium aluminum carbide (TiAlC), tantalum aluminum carbide (TaAlC), or tantalum aluminum silicide (TaSiAl). The third work function metal layer 226, the second work function metal layer 222, and the first work function metal layer 218 have different compositions. In one embodiment, the third work function 226 has a greater aluminum content than the second work function metal layer 222. When the third work function metal layer 226 includes aluminum (Al) and titanium (Ti), an aluminum contact to titanium (Al/Ti) ratio of the third work function metal layer 226 may be between about 0.7 and 0.8. In some implementations, the third work function metal layer 226 is deposited using atomic layer deposition (ALD), chemical vapor deposition (CVD), or physical vapor deposition (PVD). In some instances, the third work function metal layer 226 may be deposited to a thickness between about 1.5 nm and about 2.5 nm.

Figure 12:
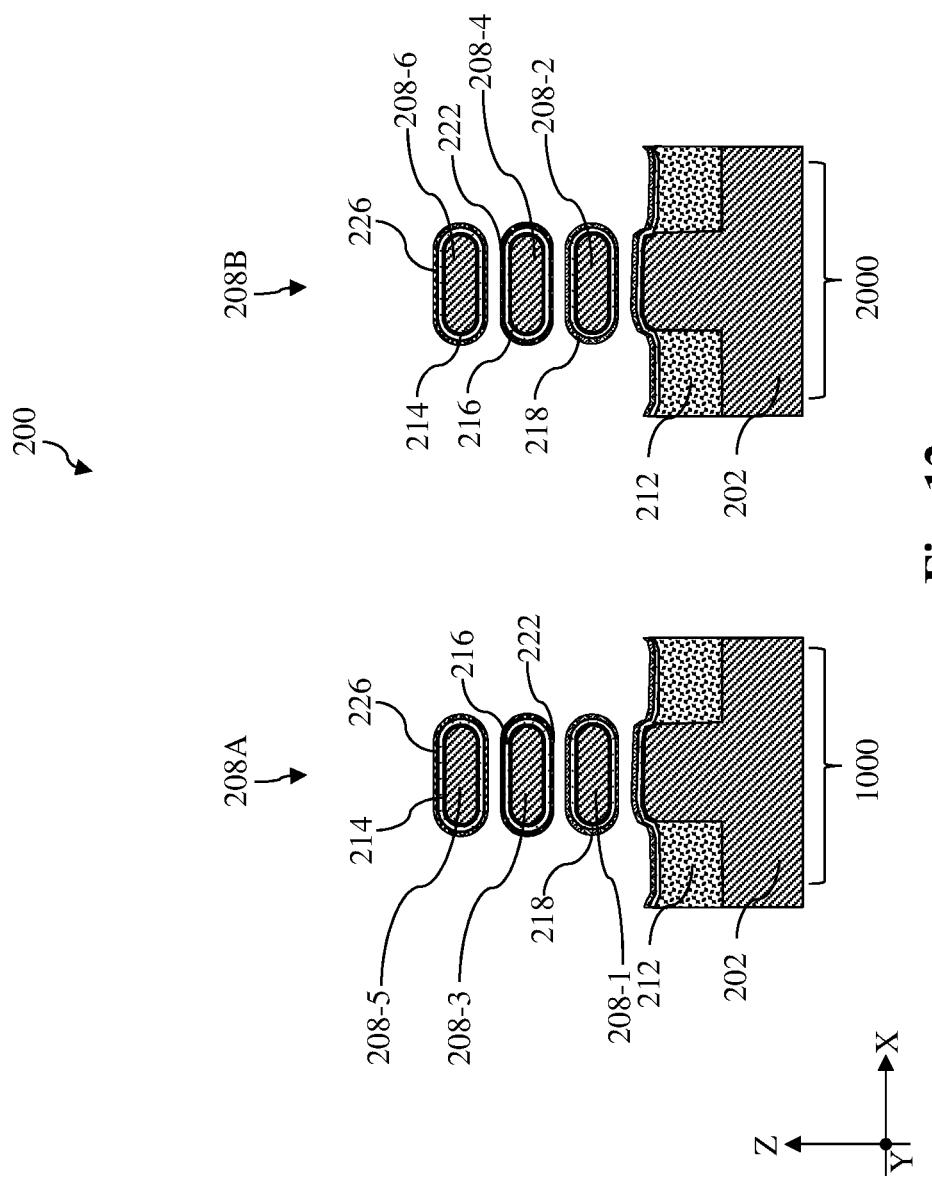

Referring to FIGS. 1 and 12, method 100 includes a block 116 where the first pattern film 220 and the second pattern film 224 are removed. In some embodiments, the first pattern film 220 and the second pattern film 224 may be selectively removed using a dry etch process that includes use of nitrogen ($N_2$), hydrogen ($H_2$), oxygen ($O_2$), argon (Ar), methane ($CH_4$), helium (He), hydrogen bromide (HBr), chlorine ($Cl_2$), or a combination thereof.

Figure 13:
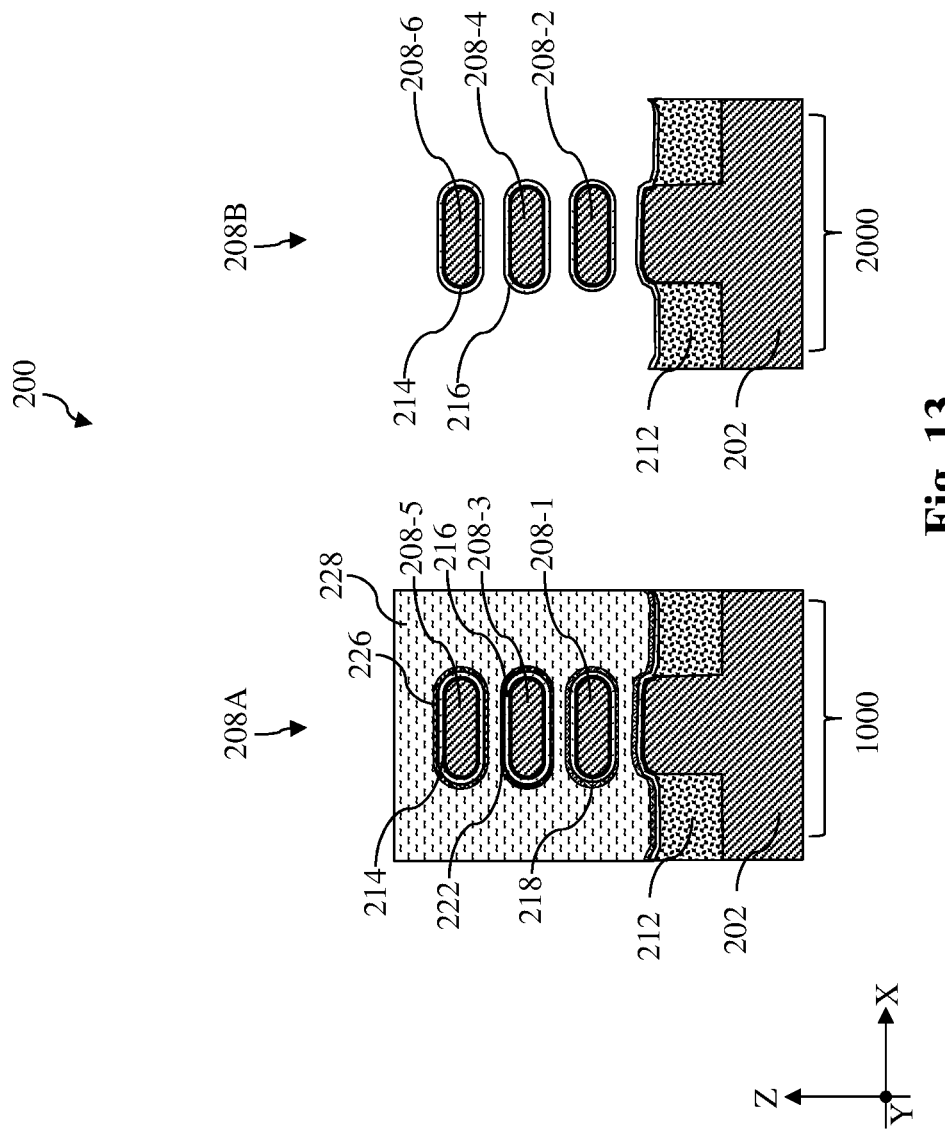

Referring to FIGS. 1 and 13, method 100 includes a block 118 where the first work functional metal layer 218, the second work function metal layer 222, and the third work function metal layer 226 are selectively removed from around the second plurality of channel members 208B over the second region 2000. Operations at block 118 include formation of a third pattern film 228 to cover the first plurality of channel members 208A in the first region 1000 and removal of the first work functional metal layer 218, the second work function metal layer 222, and the third work function metal layer 226 from the second plurality of channel members 208B in the second region 2000. Referring to FIG. 13, the third pattern film 228 may include a photoresist layer or a bottom antireflective coating (BARC) layer. In some instances, the third pattern film 228 may include silicon, nitrogen, and hydrogen. As shown in FIG. 13, the third pattern film 228 is formed to cover only the first plurality of channel members 208A in the first region 1000 while the second plurality of channel members 208B in the second region 2000 are exposed. In some instances, the third pattern film 228 may be formed by depositing a photoresist layer or a BARC layer over the workpiece 200 using spin-on coating or flowable CVD (FCVD) and then removing the deposited photoresist layer or BARC in the second region 2000. Referring to FIG. 13, with the third pattern film 228 covering the first plurality of channel members 208A, the first work functional metal layer 218, the second work function metal layer 222, and the third work function metal layer 226 around each of the second plurality of channel members 208B are selectively removed to expose the gate dielectric layer 216. In some embodiments, the first work functional metal layer 218, the second work function metal layer 222, and the third work function metal layer 226 may be etched and removed using a selective wet etch process or a selective dry etch process. Example wet etch processes may include phosphoric acid ($H_3PO_4$), nitric acid ($HNO_3$), acetic acid ($CH_3COOH$), hydrofluoric acid (HF), or a combination thereof.

Figure 14:
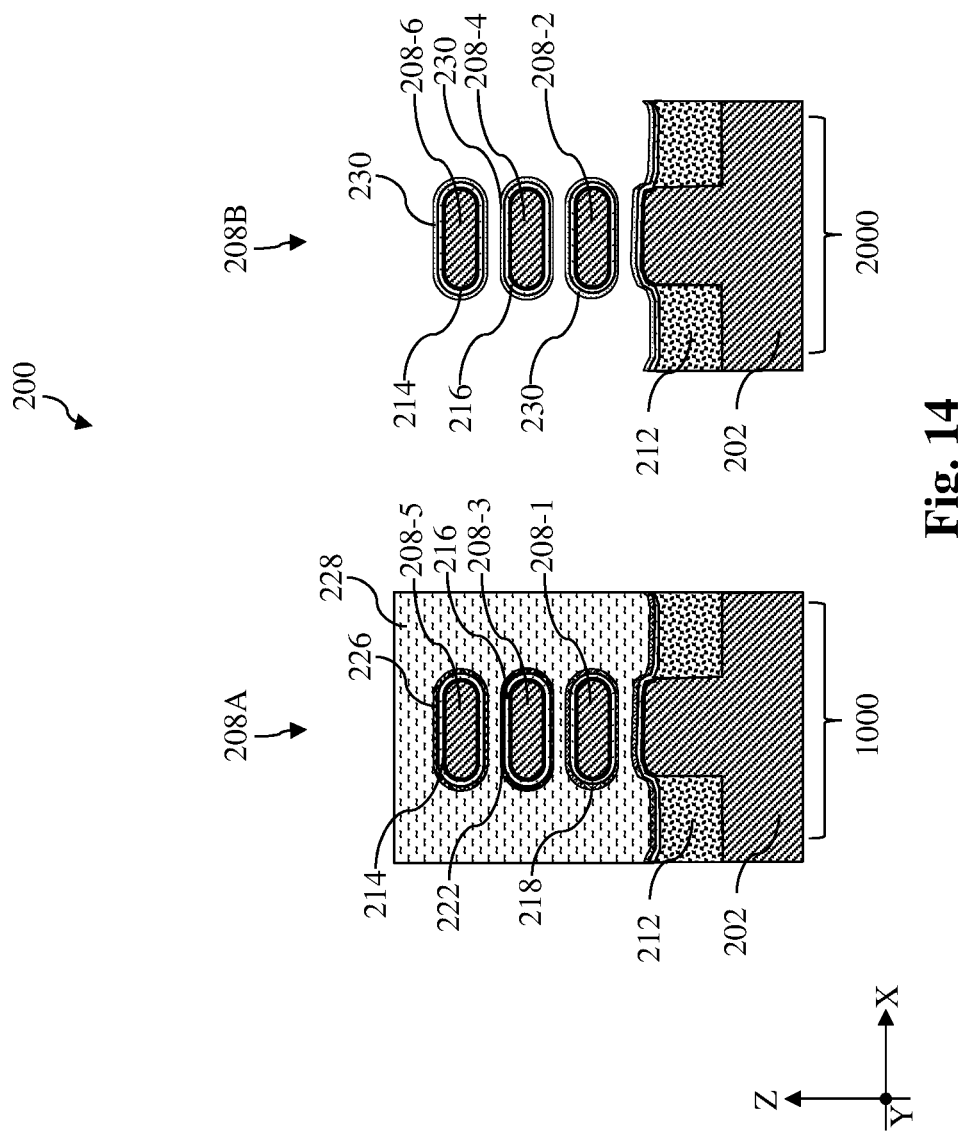

Referring to FIGS. 1 and 14, method 100 includes a block 120 where a fourth work function metal layer 230 is deposited over the second region 2000 to wrap around each of the second plurality of channel members 208B. Unlike the first work function metal layer 218, the second work function metal layer 222, and the third work function metal layer 226, the fourth work function metal layer 230 is a p-type work function metal layer and is free of aluminum (Al). In some instances, the fourth work function metal layer 230 may include titanium nitride (TiN). In some alternative embodiments, the fourth work function metal layer 230 may include titanium silicon nitride (TiSiN), tantalum nitride (TaN), tungsten carbonitride (WCN), molybdenum (Mo), or other suitable p-type work function material. In some implementations, the fourth work function metal layer 230 is deposited using atomic layer deposition (ALD), chemical vapor deposition (CVD), or physical vapor deposition (PVD). In some instances, the fourth work function metal layer 230 may be deposited to a thickness between about 1.5 nm and about 2.5 nm.

Figure 15:
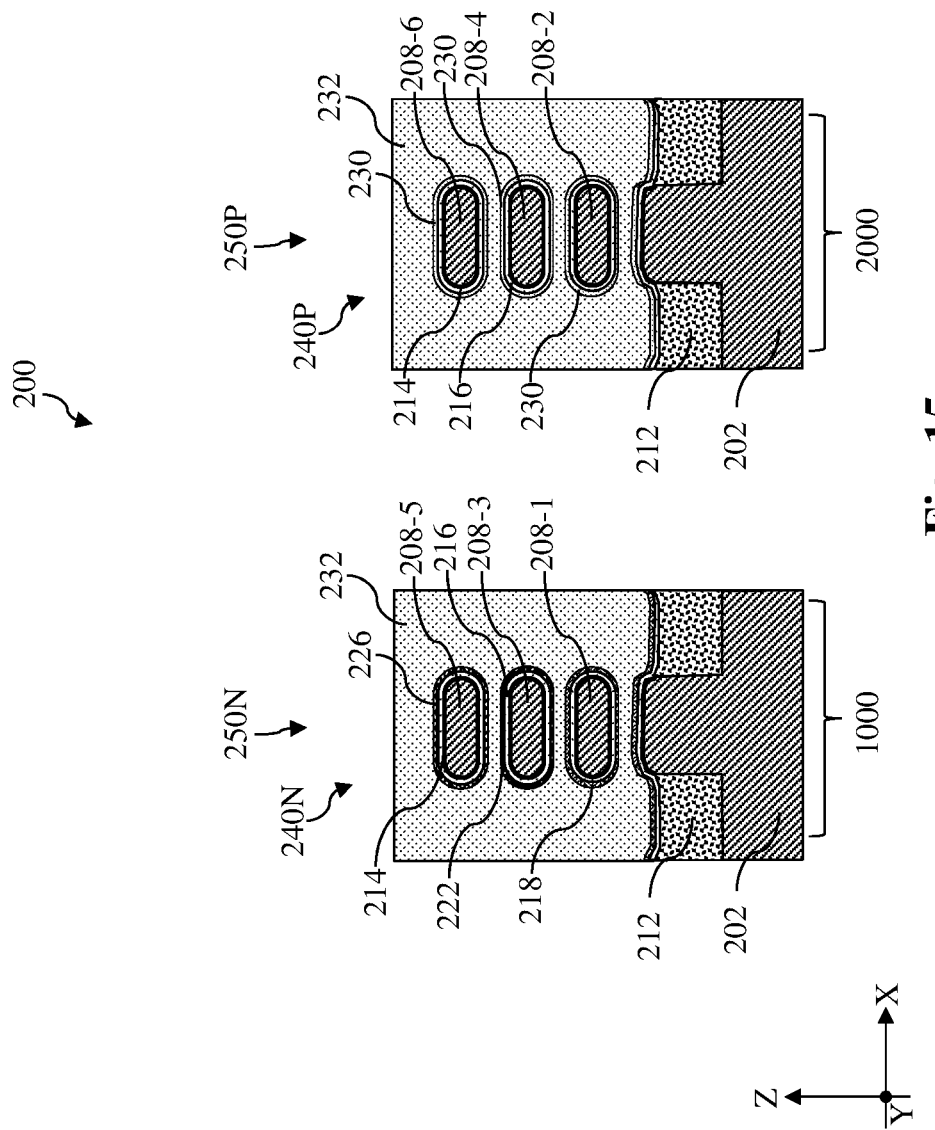
Figure 16:
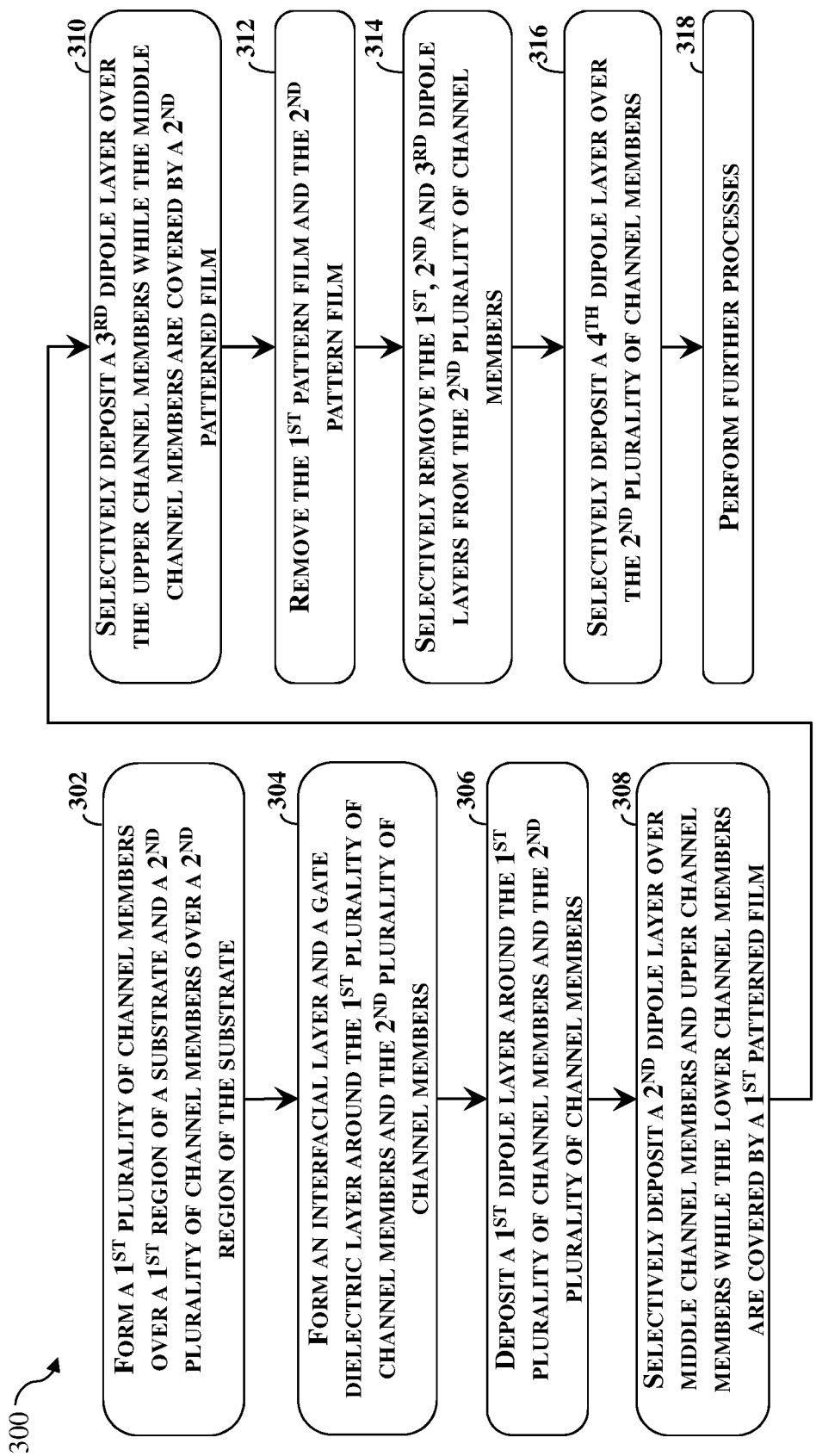
FIG. 16 is a flowchart illustrating a method of forming a semiconductor device according to various aspects of the present disclosure.

Referring to FIGS. 1 and 15, method 100 includes a block 122 where further processes are performed. Such further processes may include, for example, deposition of one or more blocking layers, deposition of one or more glue layers, and deposition of a metal capping layer. The one or more blocking layers may include titanium nitride or tantalum nitride. The one or more glue layers may include titanium nitride or tantalum nitride. The metal capping layer may include tungsten (W), fluorine-free tungsten (FFW), ruthenium (Ru), cobalt (Co), or a suitable metal. The one or more blocking layers, the one or more glue layers, and the metal capping layer are collectively referred to as a top electrode layer 232, shown in FIG. 15. The top electrode layer 232, the first work function metal layer 218, the second work function metal layer 222, the third work function metal layer 226, the gate dielectric layer 216, and the interfacial layer 214 over the first region 1000 may be collectively referred to as a first n-type gate structure 240N. The top electrode layer 232, the fourth work function metal layer 230, the gate dielectric layer 216, and the interfacial layer 214 over the second region 2000 may be collectively referred to as a first p-type gate structure 240P.

Figure 28:
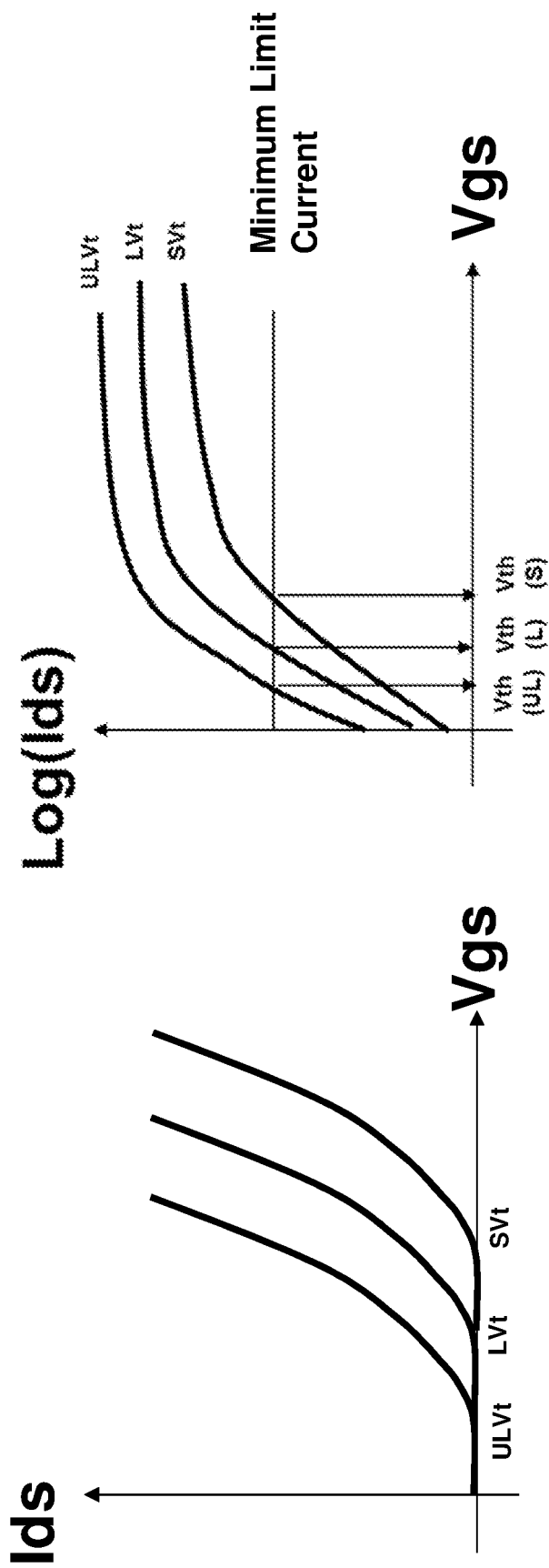
FIG. 28 is a chart illustrating a drain current (Id)-drain source voltage (Vds) relationship with respect to various transistor embodiments of the present disclosure.

Reference is still made to FIG. 15. While not explicitly shown, each of the first plurality of channel members 208A extends or is sandwiched between two n-type source/drain features that may include silicon (Si) doped with an n-type dopant, such as phosphorus (P) or arsenic (As) and each of the second plurality of channel members 208B extends or is sandwiched between two p-type source/drain features that may include silicon germanium (SiGe) doped with a p-type dopant, such as boron (B) or boron difluoride ($BF_2$). At this point, an n-type multi-threshold-voltage MBC transistor 250N is formed in the first region 1000 and a p-type MBC transistor 250P is formed in the second region 2000 of the semiconductor device 200. Because of the different work function metal layer arrangements, the n-type multi-threshold-voltage MBC transistor 250N includes a standard threshold voltage (SVt) n-type transistor, a low threshold voltage (LVt) n-type transistor, and an ultra-low threshold voltage (ULVt) n-type transistor. Reference is briefly made to FIG. 28. The graph on the left-hand side illustrates a drain current (Ids)-gate source voltage (Vgs) relationship with respect to a standard threshold voltage (SVt) n-type transistor, a low threshold voltage (LVt) n-type transistor, and an ultra-low threshold voltage (ULVt) n-type transistor according to various embodiments of the present disclosure. Compared to the channel of the standard threshold voltage (SVt) n-type transistor, channels of the low threshold voltage (LVt) n-type transistor and the ultra-low threshold voltage (ULVt) n-type transistor may be turned on at lower voltages. The graph on the right-hand side illustrates an Ids-Vgs relationship while the Ids is shown in logarithm scale. The nominal threshold voltage for each transistor is defined as the gate-source voltage at which a drain-source current is a minimum limit current, which may between 8 mA and about 12 mA, such as between about 9 mA and about 11 mA. For the curve of each transistor, the gate-source voltage corresponding to the minimum limit current is the nominal threshold voltage of the respective transistor.

The first lower member 208-1 is the channel of the standard threshold voltage (SVt) n-type transistor, the first middle member 208-3 is the channel of the low threshold voltage (LVt) n-type transistor, and the first upper member 208-5 is the channel of the ultra-low threshold voltage (ULVt) n-type transistor. The standard threshold voltage (SVt) n-type transistor is characterized by a first threshold voltage (Vt1) between about 0.3 V and about 0.35 V. The low threshold voltage (LVt) n-type transistor is characterized by a second threshold voltage (Vt2) between about 0.2 V and about 0.25V. The ultra-low threshold voltage (ULVt) n-type transistor is characterized by a third threshold voltage (Vt3) between about 0.1 and about 0.15. The first threshold voltage (Vt1) is greater than the second threshold voltage (Vt2) and the second threshold voltage (Vt2) is greater than the third threshold voltage (Vt3). When turned on, the standard threshold voltage (SVt) n-type transistor may have a first saturated drain current (Idsat 1) between about 50 μA and about 80 μA; the low threshold voltage (LVt) n-type transistor may have a second saturated drain current (Idsat 2) between about 100 μA and about 130 μA; and the ultralow threshold voltage (ULVt) n-type transistor may have a third saturated drain current (Idsat 3) between about 150 μA and about 180 μA. The third saturated drain current (Idsat 3) is greater than the second saturated drain current (Idsat 2) and the first saturated drain current (Idsat 1). Because of the identical work function metal layer arrangements in the second region 2000, p-type MBC transistor 250P serves as a standard threshold voltage (SVt) p-type transistor. The standard threshold voltage (SVt) p-type transistor is characterized by a threshold voltage between about 0.3 V and about 0.35 V.

In some alternative embodiments represented by method 300 in FIG. 16, the lower channel members, the middle channel members, and the upper channel members are wrapped around by different thickness of dipole layers to achieve different threshold voltages.

Figure 17:
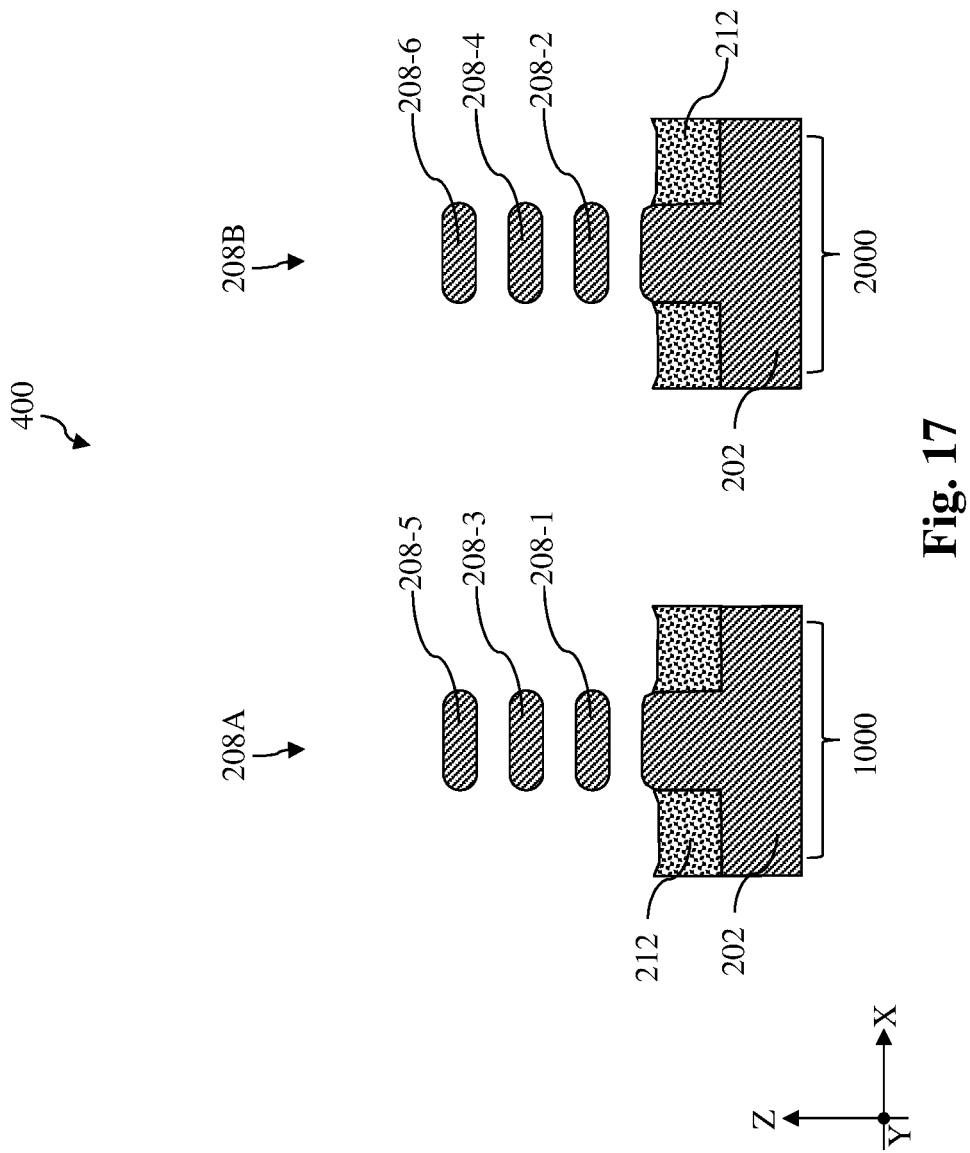
FIGS. 17-27 illustrate fragmentary cross-sectional views of the workpiece at various stages of fabrication in accordance with the method in FIG. 16.

Referring now to FIGS. 16 and 17, the method 300 includes a block 302 where a first plurality of channel members 208A are formed over a first region 1000 and a second plurality of channel members 208B are formed over a second region 2000. Operations at block 302 are substantially similar to those at block 102 with the exception that the operations in method 300 are performed to a workpiece 400, which is similar to the workpiece 200. Detailed description of the operations at block 302 are omitted.

Figure 18:
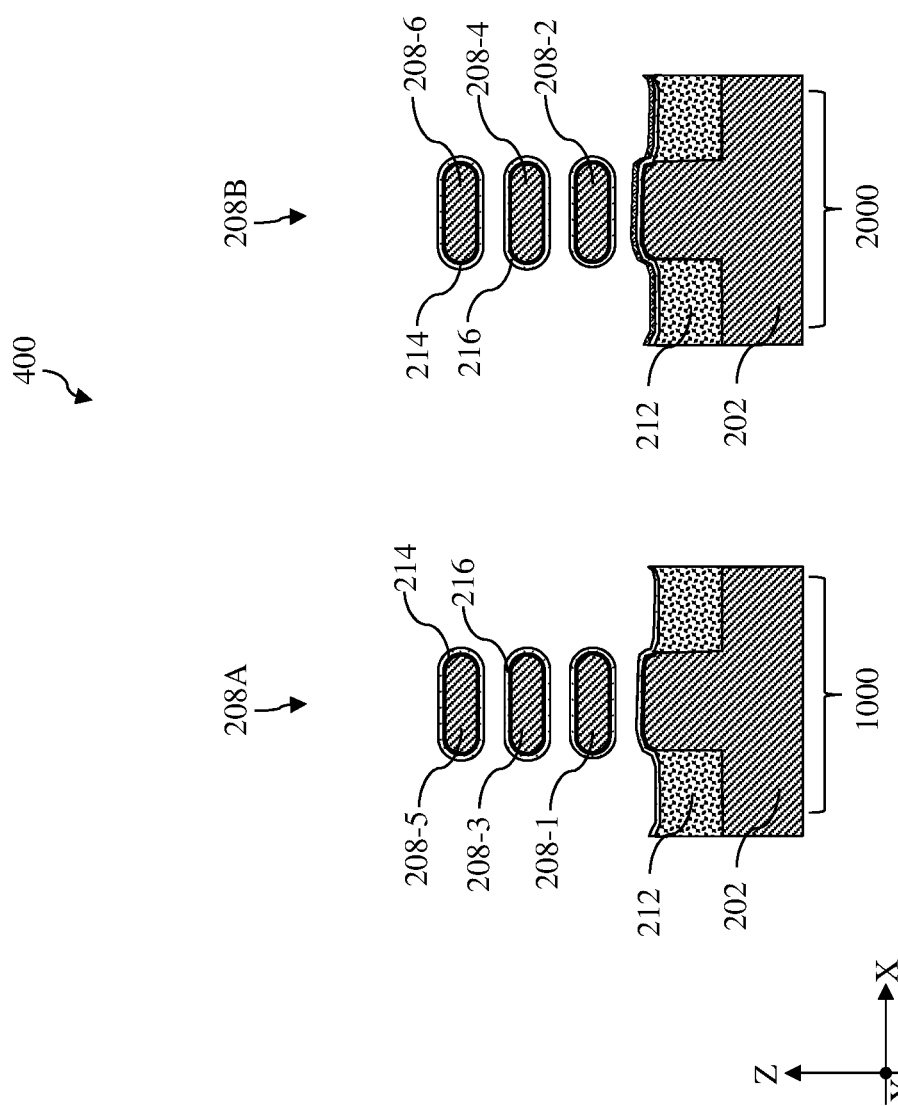

Referring to FIGS. 16 and 18, the method 300 includes a block 304 where an interfacial layer 214 and a gate dielectric layer 216 are formed to wrap around each of the first plurality of channel members 208A and the second plurality of channel members 208B. Operations at block 304 are substantially similar to those at block 104. Detailed description of the operations at block 304 are omitted.

Figure 19:
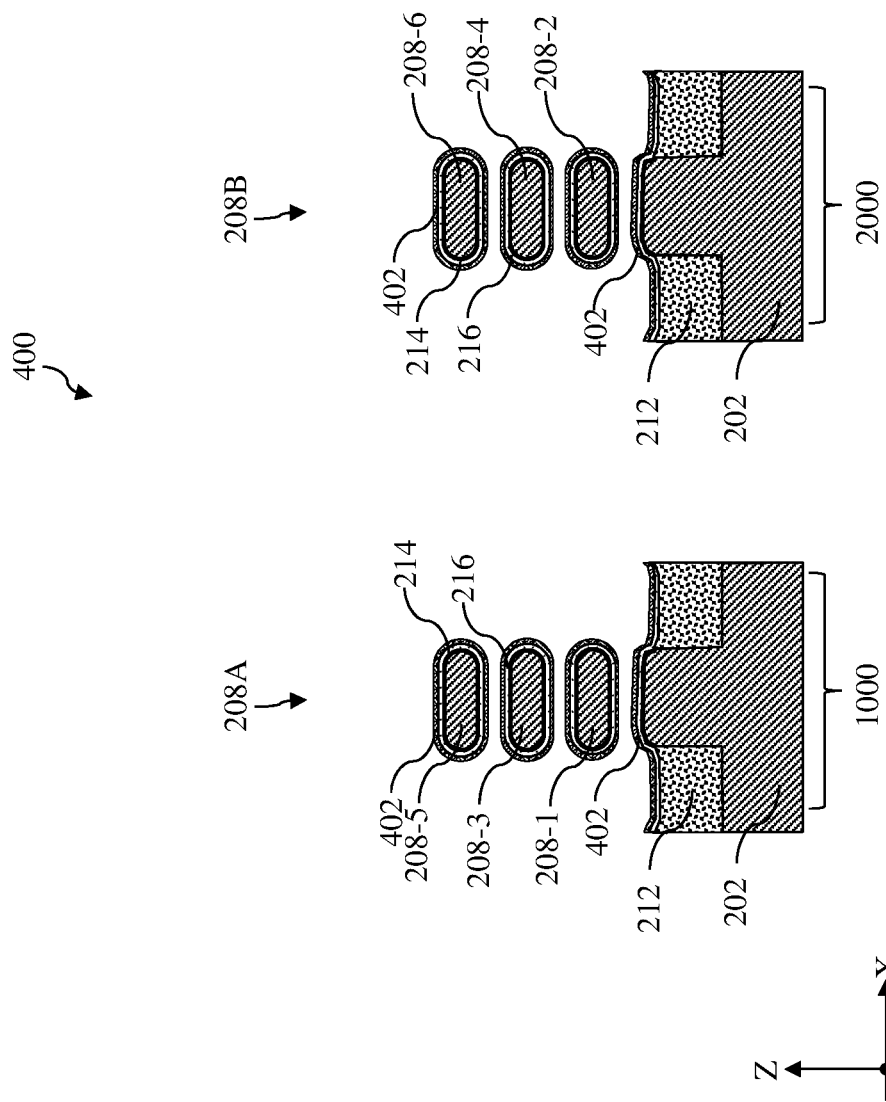

Referring to FIGS. 16 and 19, method 300 includes a block 306 where a first dipole layer 402 is deposited to wrap around each of the first plurality of channel members 208A and each of the second plurality of channel members 208B. The first dipole layer 402 is an n-type dipole layer. In some embodiments, the first dipole layer 402 may include lanthanum oxide (LaO) or a suitable metal oxide. In some implementations, the first dipole layer 402 is deposited using atomic layer deposition (ALD), chemical vapor deposition (CVD), or physical vapor deposition (PVD). In some instances, the first dipole layer 402 may be deposited to a thickness between about 1.5 nm and about 2.5 nm.

Figure 20:
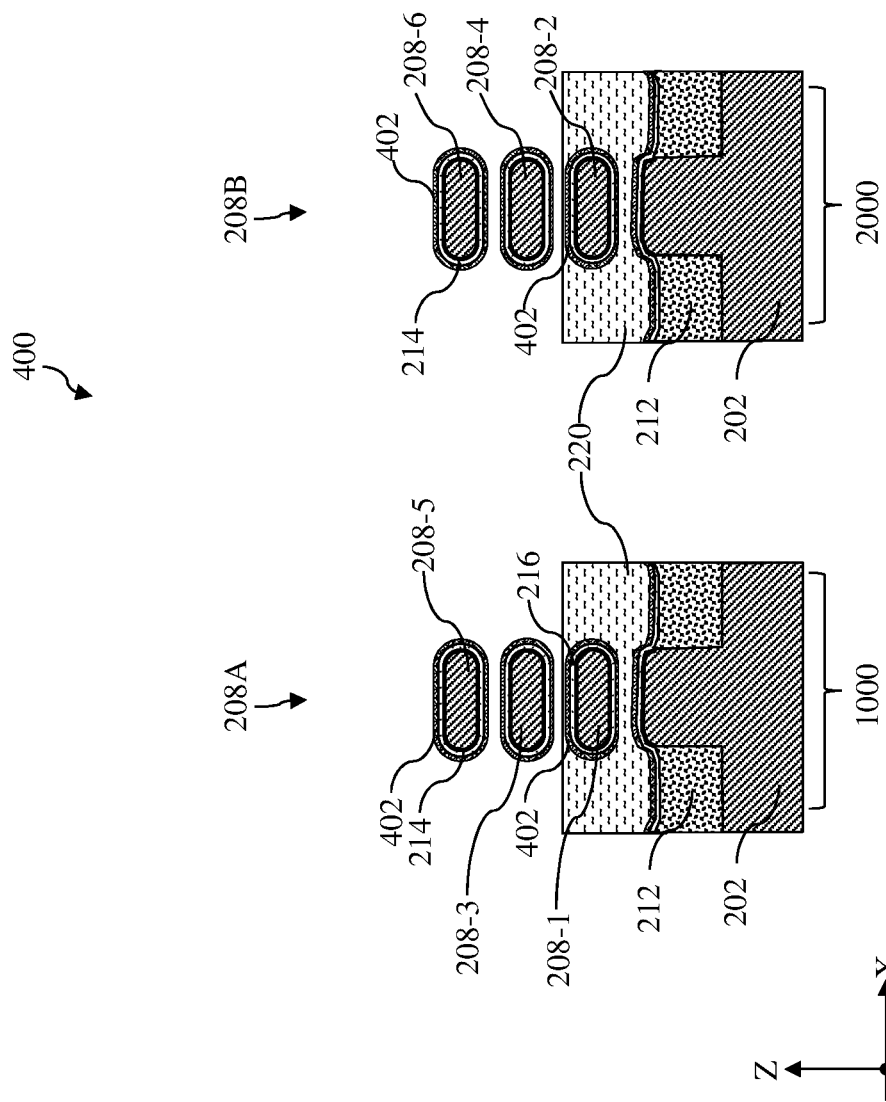
Figure 21:
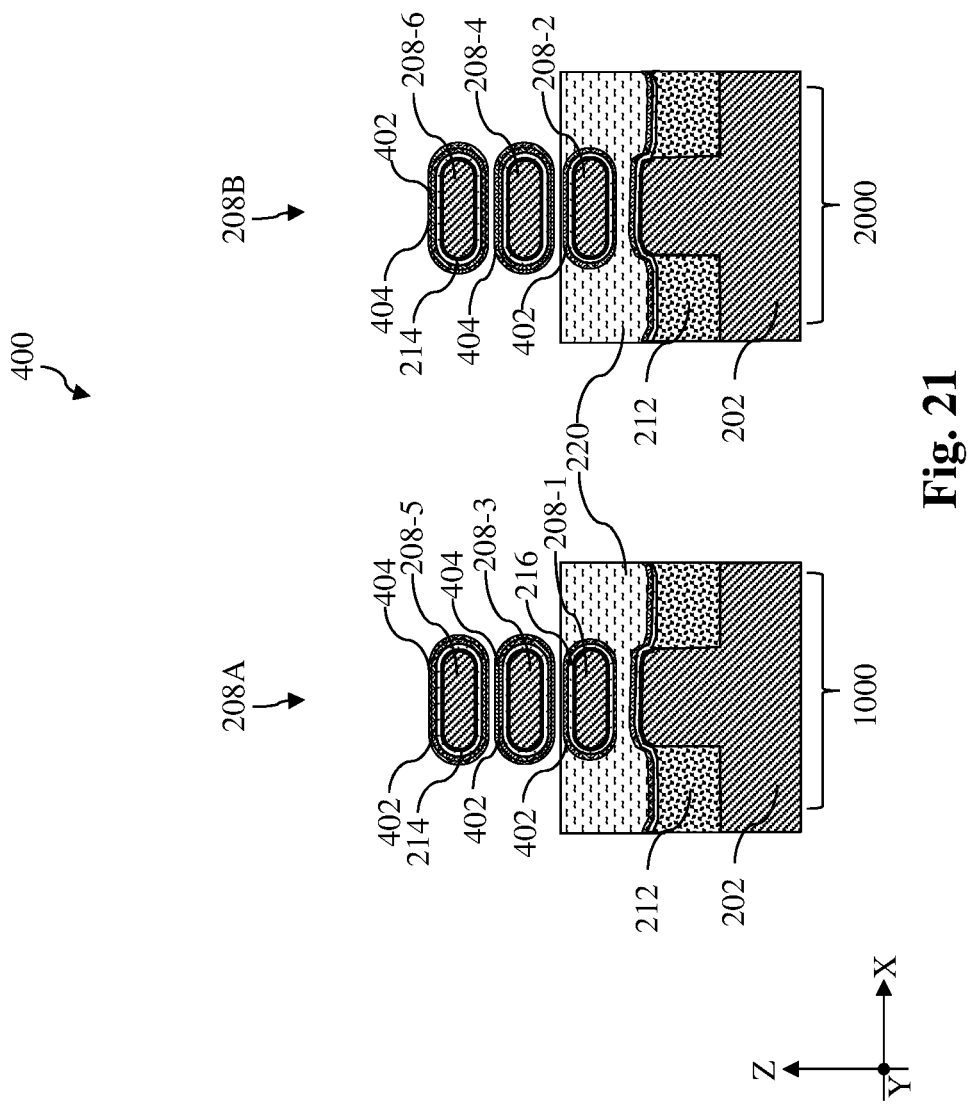

Referring to FIGS. 16, 20 and 21, method 300 includes a block 308 where a second dipole layer 404 is selectively deposited to wrap around the middle channel members and upper channel members while the lower channel members are covered by a first pattern film 220. Operations at block 308 include formation of the first pattern film 220 to cover the lower channel members and expose the middle channel members and upper channel members (shown in FIG. 20) and selective deposition of the second dipole layer 404 around the middle channel members and the upper channel members (shown in FIG. 21). Referring first to FIG. 20, the first pattern film 220 may include a photoresist layer or a bottom antireflective coating (BARC) layer. In some instances, the first pattern film 220 may include silicon, nitrogen, and hydrogen. As shown in FIG. 20, the first pattern film 220 is formed to cover only the lower channel members (including the first lower member 208-1 and the second lower member 208-2) while the middle channel members (including the first middle member 208-3 and the second middle member 208-4) and the upper channel members (including the first upper member 208-5 and the second upper member 208-6) and the first dipole layer 402 thereon are exposed. In some instances, the first pattern film 220 may be formed by depositing a photoresist layer or a BARC layer using spin-on coating or flowable CVD (FCVD) and then etching back the deposited photoresist layer or BARC to the desired thickness to cover the lower channel members. Referring to FIG. 21, with the first pattern film 220 covering the lower channel members, the second dipole layer 404 are deposited over the first dipole layer 402 and around the middle channel members and the upper channel members. Like the first dipole layer 402, the second dipole layer 404 is an n-type dipole layer. In some embodiments, the second dipole layer 404 may include lanthanum oxide (LaO) or a suitable metal oxide. In some implementations, the second dipole layer 404 is deposited using atomic layer deposition (ALD), chemical vapor deposition (CVD), or physical vapor deposition (PVD). In some instances, the second dipole layer 404 may be deposited to a thickness between about 1.5 nm and about 2.5 nm. The second dipole layer 404 may be substantially similar to the first dipole layer 402 in terms of composition and thickness. Because the similarity between the first dipole layer 402 and the second dipole layer 404, the second dipole layer 404 may be regarded as a second application of the first dipole layer 402. That is, upon conclusion of the operations at block 308, the lower channel members are covered by a single thickness of the first dipole layer 402 while the middle channel members and upper channel members are covered by two layers of the first dipole layer 402.

Figure 22:
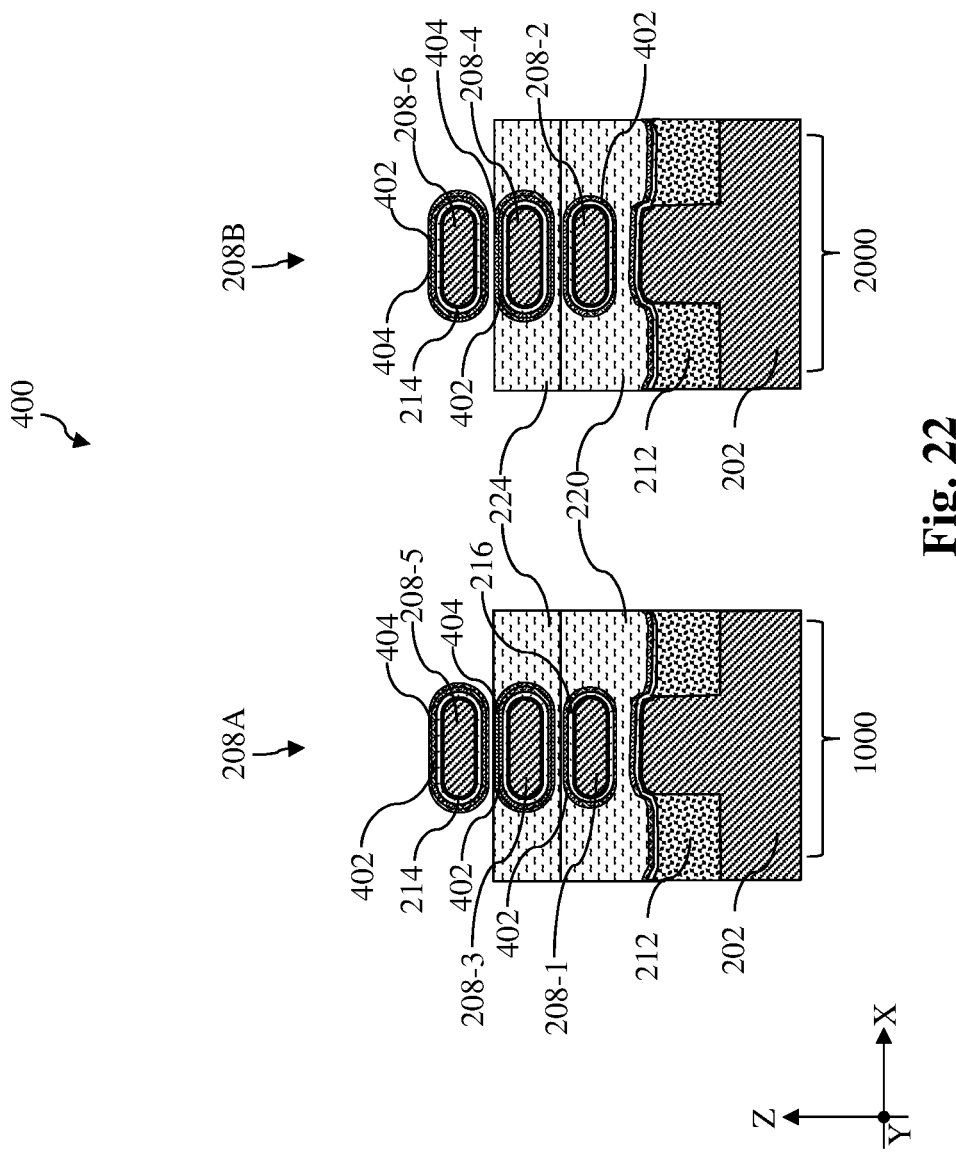
Figure 23:
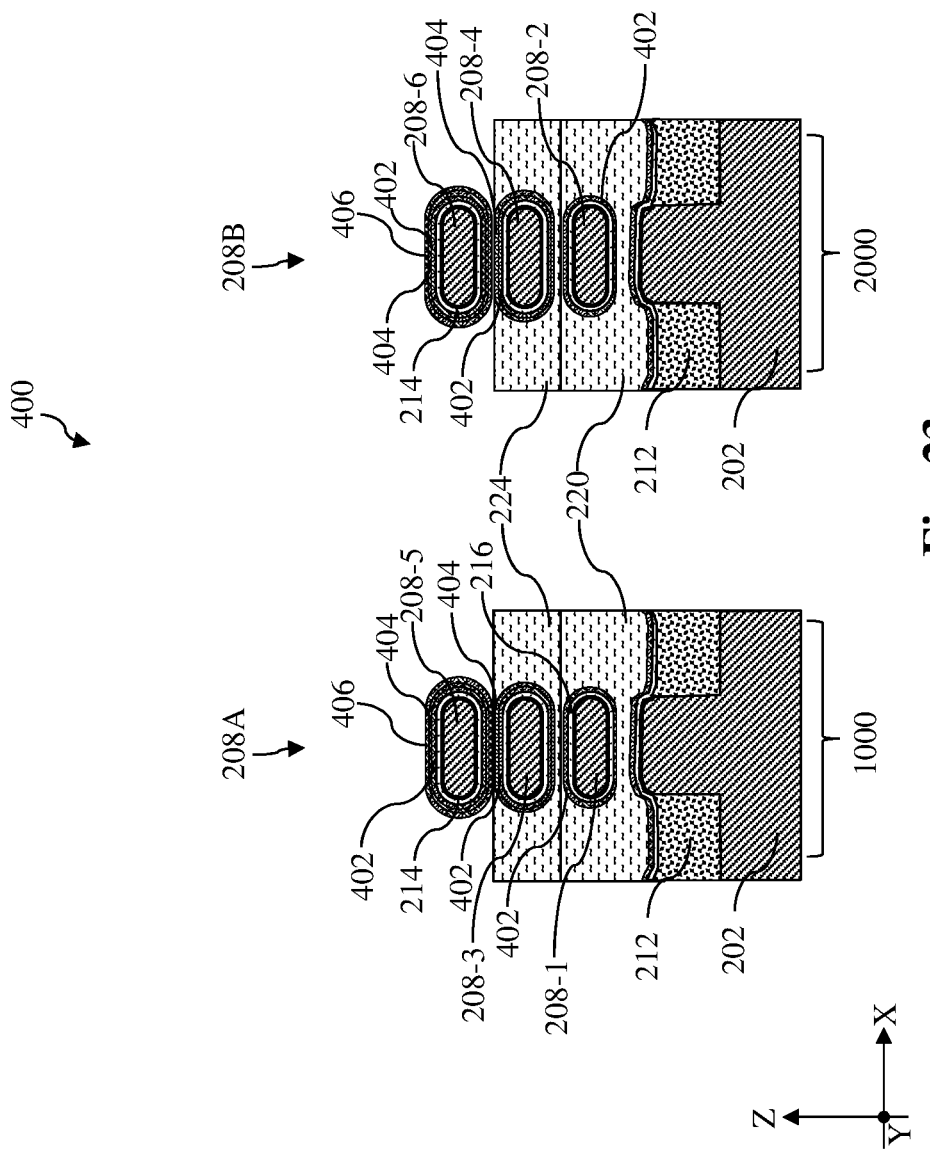

Referring to FIGS. 16, 22 and 23, method 300 includes a block 310 where a third dipole layer 406 is selectively deposited to wrap around the upper channel members while the middle channel member are covered by a second pattern film 224. Operations at block 310 include formation of the second pattern film 224 to cover the middle channel members and expose the upper channel members (shown in FIG. 22) and selective deposition of the third dipole layer 406 around the upper channel members (shown in FIG. 23). It is noted that the lower channel members, along with the first dipole layer 402 around them, remain covered by the first pattern film 220. Referring first to FIG. 22, the second pattern film 224 may include a photoresist layer or a bottom antireflective coating (BARC) layer. In some instances, the second pattern film 224 may include silicon, nitrogen, and hydrogen. As shown in FIG. 22, the second pattern film 224 is formed to cover only the middle channel members (including the first middle member 208-3 and the second middle member 208-4) while the upper channel members (including the first upper member 208-5 and the second upper member 208-6) and second dipole layer 404 thereon are exposed. In some instances, the second pattern film 224 may be formed by depositing a photoresist layer or a BARC layer using spin-on coating or flowable CVD (FCVD) and then etching back the deposited photoresist layer or BARC to the desired thickness to cover the middle channel members. Referring to FIG. 23, with the second pattern film 224 covering the middle channel members, the third dipole layer 406 are deposited over the second dipole layer 404 and around the upper channel members. Like the first dipole layer 402 and the second dipole layer 404, the third dipole layer 406 is an n-type dipole layer. In some embodiments, the third dipole layer 406 may include lanthanum oxide (LaO) or a suitable metal oxide. In some implementations, the third dipole layer 406 is deposited using atomic layer deposition (ALD), chemical vapor deposition (CVD), or physical vapor deposition (PVD). In some instances, the third dipole layer 406 may be deposited to a thickness between about 1.5 nm and about 2.5 nm. The third dipole layer 406 may be substantially similar to the first dipole layer 402 in terms of composition and thickness. Because the similarity between the first dipole layer 402 and the third dipole layer 406, the third dipole layer 406 may be regarded as a third application of the first dipole layer 402. That is, upon conclusion of the operations at block 310, the lower channel members are covered by a single thickness of the first dipole layer 402, the middle channel members are covered by two layers of the first dipole layer 402, and the upper channel members are covered by three layers of the first dipole layer 402.

Figure 24:
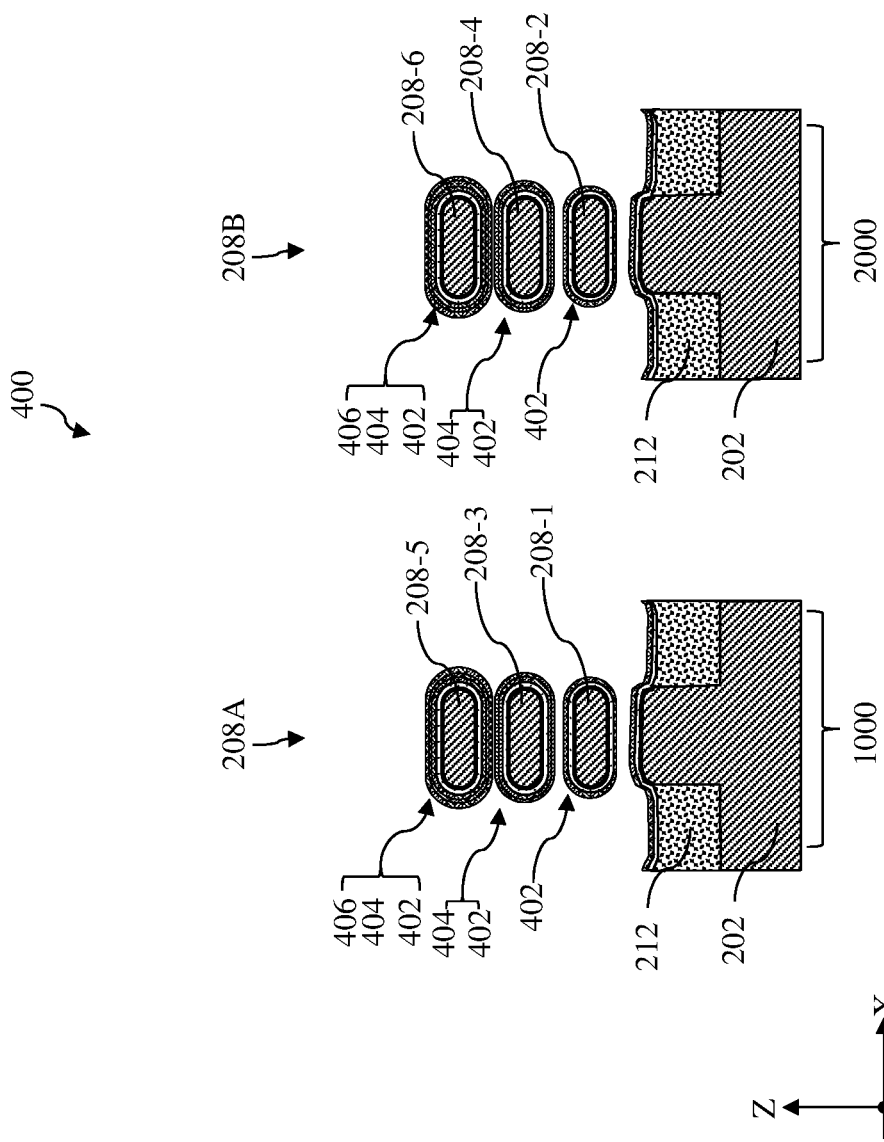

Referring to FIGS. 16 and 24, method 300 includes a block 312 where the first pattern film 220 and the second pattern film 224 are removed. In some embodiments, the first pattern film 220 and the second pattern film 224 may be selectively removed using a dry etch process that includes use of nitrogen ($N_2$), hydrogen ($H_2$), oxygen ($O_2$), argon (Ar), methane ($CH_4$), helium (He), hydrogen bromide (HBr), chlorine ($Cl_2$), or a combination thereof.

Figure 25:
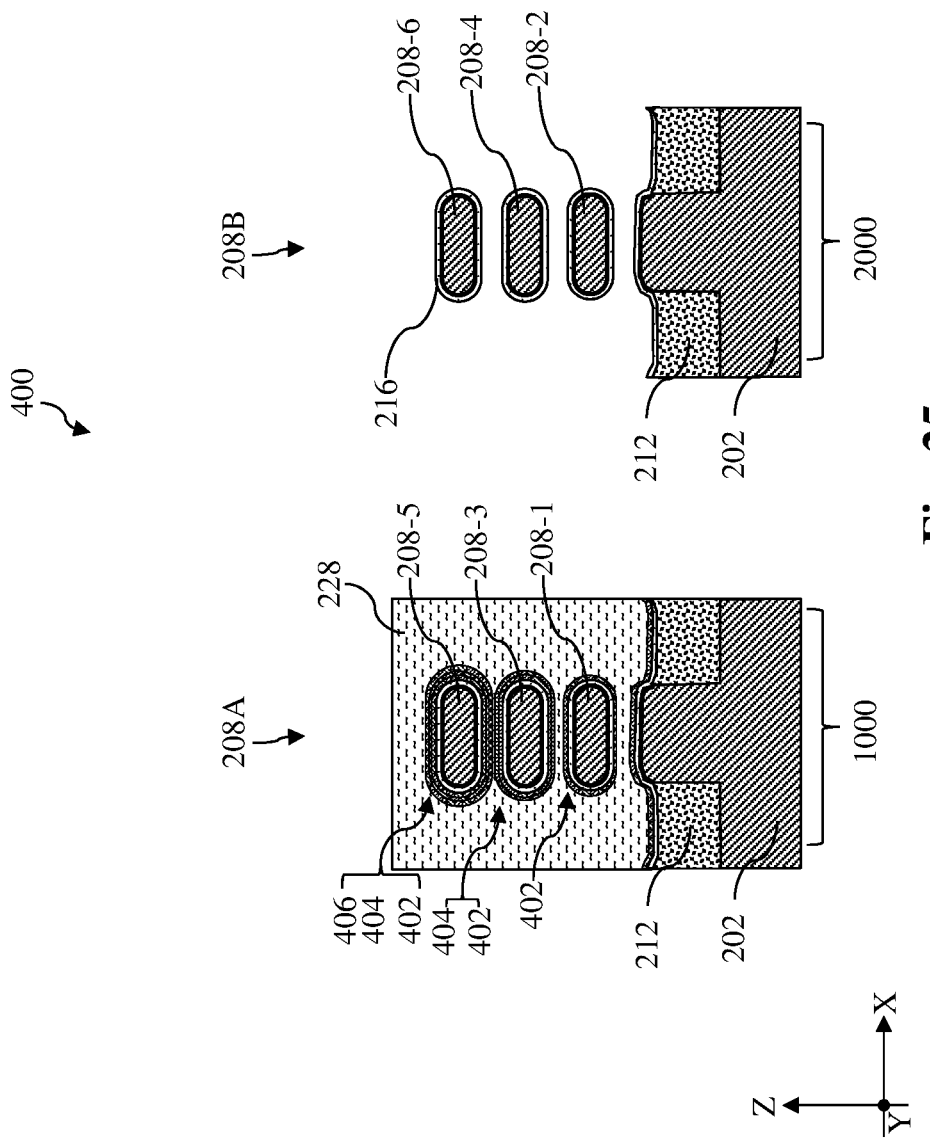

Referring to FIGS. 16 and 25, method 300 includes a block 314 where the first dipole layer 402, the second dipole layer 404, and the third dipole layer 406 are selectively removed from around the second plurality of channel members 208B over the second region 2000. Operations at block 314 include formation of a third pattern film 228 to cover the first plurality of channel members 208A in the first region 1000 and removal of the first dipole layer 402, the second dipole layer 404, and the third dipole layer 406 from the second plurality of channel members 208B in the second region 2000. Referring to FIG. 25, the third pattern film 228 may include a photoresist layer or a bottom antireflective coating (BARC) layer. In some instances, the third pattern film 228 may include silicon, nitrogen, and hydrogen. As shown in FIG. 25, the third pattern film 228 is formed to cover only the first plurality of channel members 208A in the first region 1000 while the second plurality of channel members 208B in the second region 2000 are exposed. In some instances, the third pattern film 228 may be formed by depositing a photoresist layer or a BARC layer over the workpiece 200 using spin-on coating or flowable CVD (FCVD) and then removing the deposited photoresist layer or BARC in the second region 2000. Referring to FIG. 25, with the third pattern film 228 covering the first plurality of channel members 208A, the first dipole layer 402, the second dipole layer 404, and the third dipole layer 406 around each of the second plurality of channel members 208B are selectively removed to expose the gate dielectric layer 216. In some embodiments, the first dipole layer 402, the second dipole layer 404, and the third dipole layer 406 may be etched and removed using a selective wet etch process or a selective dry etch process. Example wet etch processes may include phosphoric acid ($H_3PO_4$), nitric acid ($HNO_3$), acetic acid ($CH_3COOH$), hydrochloric acid (HCl), sulfuric acid ($H_2SO_4$), hydrofluoric acid (HF), or a combination thereof. Example dry etch processes may include plasma of argon, hydrogen ($H_2$), a fluorine-containing gas (e.g., $CF_4$, $SF_6$, $CH_2F_2$, $CH_3F$, $CHF_3$, and/or $C_2F_6$), a chlorine-containing gas (e.g., $Cl_2$, $CHCl_3$, $CCl_4$, and/or $BCl_3$), a hydrocarbon species (e.g. $CH_4$), a bromine-containing gas (e.g., HBr and/or $CHBr_3$), or a combination thereof.

Figure 26:
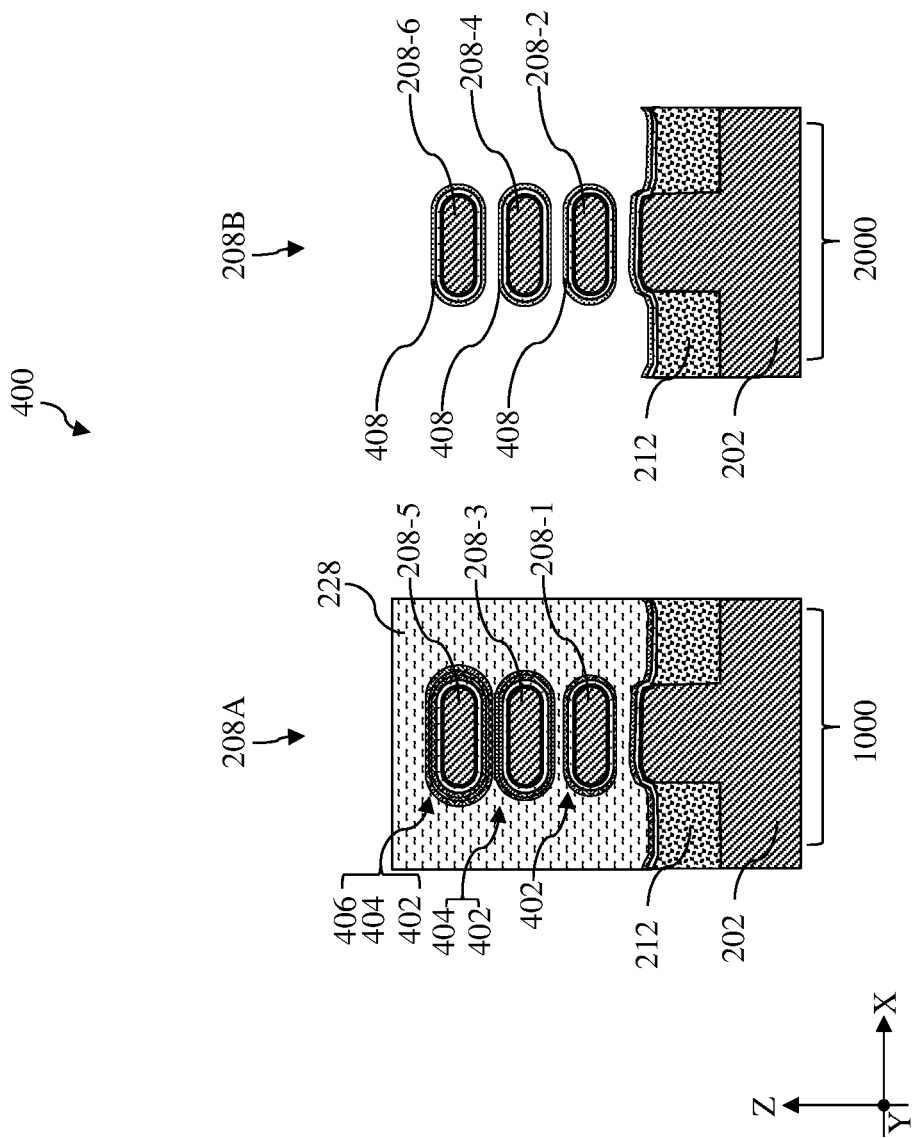

Referring to FIGS. 16 and 26, method 300 includes a block 316 where a fourth dipole layer 408 is deposited over the second region 2000 to wrap around each of the second plurality of channel members 208B. Unlike the first dipole layer 402, the second dipole layer 404, and the third dipole layer 406, the fourth dipole layer 408 is a p-type dipole layer and is free of lanthanum (La). In some instances, the fourth dipole layer 408 may include aluminum oxide (AlO) or other lanthanum-free metal oxide. In some implementations, the fourth dipole layer 408 is deposited using atomic layer deposition (ALD), chemical vapor deposition (CVD), or physical vapor deposition (PVD). In some instances, the fourth dipole layer 408 may be deposited to a thickness between about 1.5 nm and about 2.5 nm.

Figure 27:
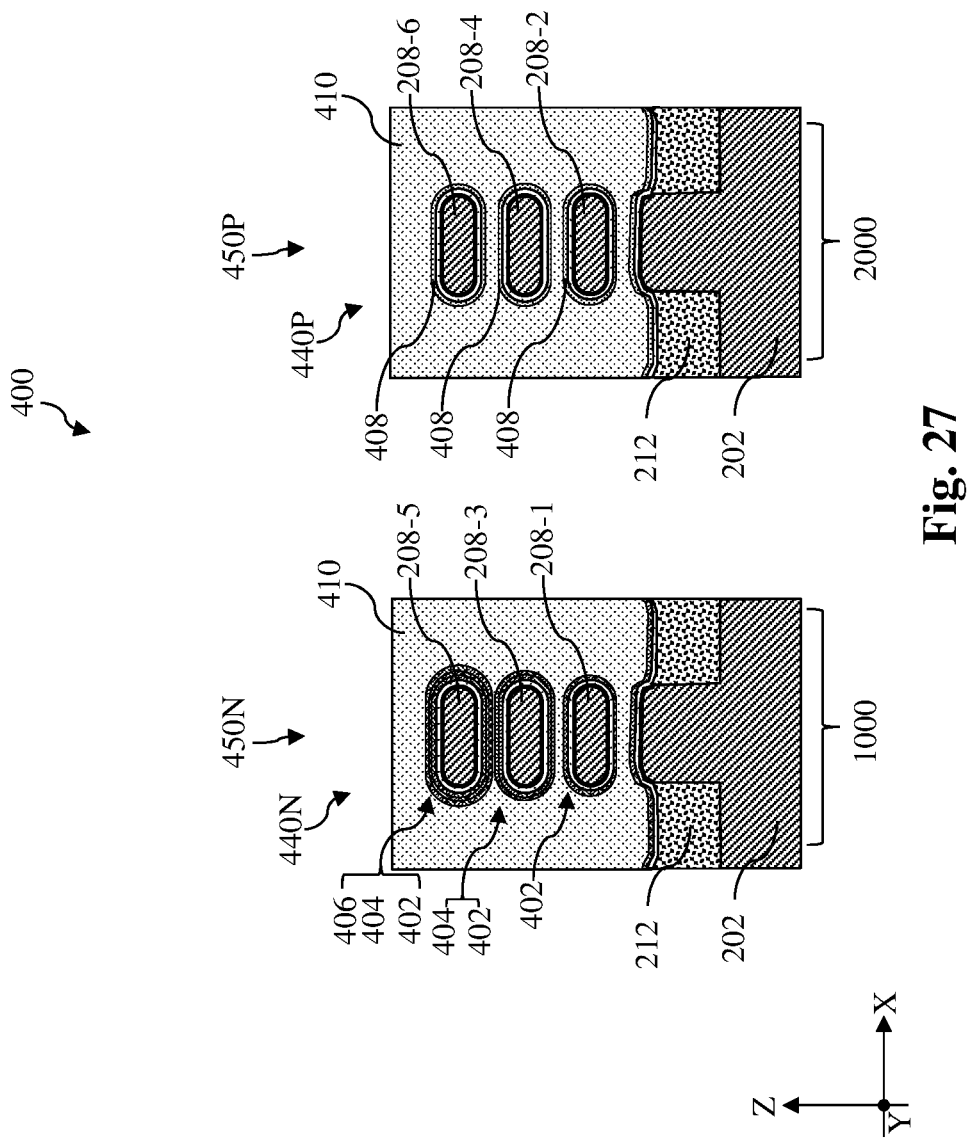

Referring to FIGS. 16 and 27, method 300 includes a block 318 where further processes are performed. Such further processes may include, for example, deposition of one or more blocking layers, deposition of one or more glue layers, and deposition of a metal capping layer. The one or more blocking layers may include titanium nitride or tantalum nitride. The one or more glue layers may include titanium nitride or tantalum nitride. The metal capping layer may include tungsten (W), fluorine-free tungsten (FFW), ruthenium (Ru), cobalt (Co), or a suitable metal. The one or more blocking layers, the one or more glue layers, and the metal capping layer are collectively referred to as a top electrode layer 410, shown in FIG. 27. The top electrode layer 410, the first dipole layer 402, the second dipole layer 404, and the third dipole layer 406, the gate dielectric layer 216, and the interfacial layer 214 over the first region 1000 may be collectively referred to as a second n-type gate structure 440N. The top electrode layer 410, the fourth dipole layer 408, the gate dielectric layer 216, and the interfacial layer 214 over the second region 2000 may be collectively referred to as a second p-type gate structure 440P.

Reference is still made to FIG. 27. While not explicitly shown, each of the first plurality of channel members 208A extends or is sandwiched between two n-type source/drain features that may include silicon (Si) doped with an n-type dopant, such as phosphorus (P) or arsenic (As) and each of the second plurality of channel members 208B extends or is sandwiched between two p-type source/drain features that may include silicon germanium (SiGe) doped with a p-type dopant, such as boron (B) or boron difluoride ($BF_2$). At this point, an n-type multi-threshold-voltage MBC transistor 450N is formed in the first region 1000 and a p-type MBC transistor 450P is formed in the second region 2000 of the semiconductor device 400. Because of the different work function metal layer arrangements, the n-type multi-threshold-voltage MBC transistor 450N includes a standard threshold voltage (SVt) n-type transistor, a low threshold voltage (LVt) n-type transistor, and an ultra-low threshold voltage (ULVt) n-type transistor. The first lower member 208-1 is the channel of the standard threshold voltage (SVt) n-type transistor, the first middle member 208-3 is the channel of the low threshold voltage (LVt) n-type transistor, and the first upper member 208-5 is the channel of the ultra-low threshold voltage (ULVt) n-type transistor. The standard threshold voltage (SVt) n-type transistor is characterized by a first threshold voltage (Vt1) between about 0.3 V and about 0.35 V. The low threshold voltage (LVt) n-type transistor is characterized by a second threshold voltage (Vt2) between about 0.2 V and about 0.25V. The ultra-low threshold voltage (ULVt) n-type transistor is characterized by a third threshold voltage (Vt3) between about 0.1 and about 0.15. The first threshold voltage (Vt1) is greater than the second threshold voltage (Vt2) and the second threshold voltage (Vt2) is greater than the third threshold voltage (Vt3). When turned on, the standard threshold voltage (SVt) n-type transistor may have a first saturated drain current (Idsat 1) between about 50 μA and about 80 μA; the low threshold voltage (LVt) n-type transistor may have a second saturated drain current (Idsat 2) between about 100 μA and about 130 μA; and the ultralow threshold voltage (ULVt) n-type transistor may have a third saturated drain current (Idsat 3) between about 150 μA and about 180 μA. The third saturated drain current (Idsat 3) is greater than the second saturated drain current (Idsat 2) and the first saturated drain current (Idsat 1). Because of the identical work function metal layer arrangements in the second region 2000, p-type MBC transistor 450P serves as a standard threshold voltage (SVt) p-type transistor. The standard threshold voltage (SVt) p-type transistor is characterized by a threshold voltage between about 0.3 V and about 0.35 V.

Figure 29:
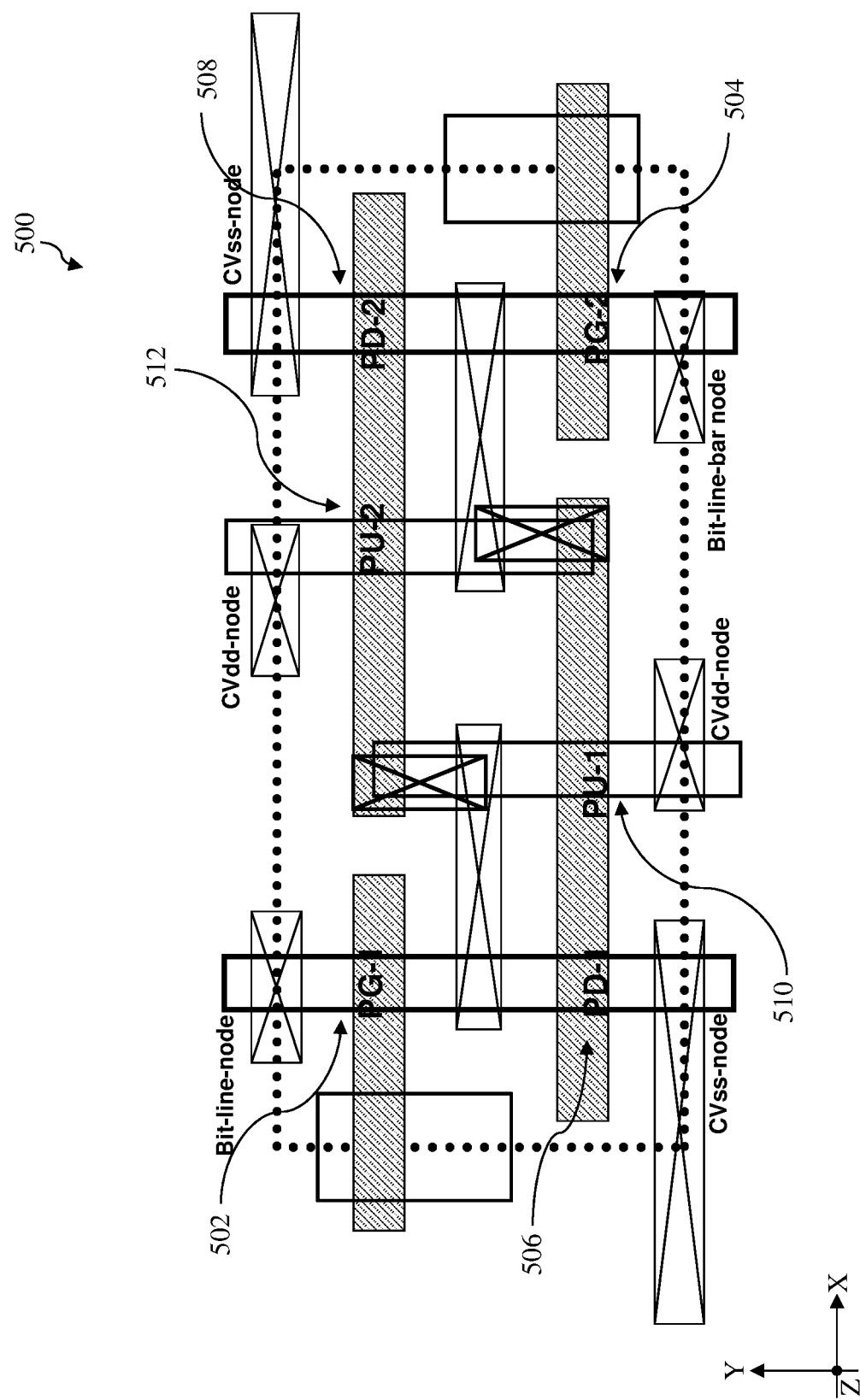
FIG. 29 illustrates a top layout view of a memory cell implementing the semiconductor device according to various aspects of the present disclosure.

The n-type multi-threshold-voltage MBC transistor 250N, p-type MBC transistor 250P shown in FIG. 15 or n-type multi-threshold-voltage MBC transistor 450N, p-type MBC transistor 450P shown in FIG. 27 may be implemented in an SRAM cell, such as an SRAM cell 500 shown in FIG. 29. As shown in FIG. 29, the SRAM cell 500 includes six transistors and may be referred to as a 6T SRAM cell. The SRAM cell 500 includes a first pass-gate transistor (PG-1) 502, a second pass-gate transistor (PG-2) 504, a first pull-down transistor (PD-1) 506, a second pull-down transistor (PD-2) 508, a first pull-up transistor (PU-1) 510, and a second pull-up transistor (PU-2) 512. Active regions of the first pass-gate transistor (PG-1) 502 and first pull-down transistor (PD-1) 506 may be continuous. Active regions of the second pass-gate transistor (PG-2) 504 and second pull-down transistor (PD-2) 508 may be continuous. In some embodiments, the first pass-gate transistor (PG-1) 502 and first pull-down transistor (PD-1) 506 may be n-type transistors formed over a first p-type well. The second pass-gate transistor (PG-2) 504 and second pull-down transistor (PD-2) 508 may be n-type transistors formed over a second p-type well. The first pull-up transistor (PU-1) 510 and the second pull-up transistor (PU-2) 512 may be p-type transistors formed over an n-type well disposed between the first p-type well and the second p-type well. In one embodiment, the first pass-gate transistor (PG-1) 502, the first pull-down transistor (PD-1) 506, the second pass-gate transistor (PG-2) 504, the second pull-down transistor (PD-2) 508 may each be the n-type multi-threshold-voltage MBC transistor 250N while the first pull-up transistor (PU-1) 510 and the second pull-up transistor (PU-2) 512 may each be the p-type MBC transistor 250P. In another embodiment, the first pass-gate transistor (PG-1) 502, the first pull-down transistor (PD-1) 506, the second pass-gate transistor (PG-2) 504, the second pull-down transistor (PD-2) 508 may each be the n-type multi-threshold-voltage MBC transistor 450N while the first pull-up transistor (PU-1) 510 and the second pull-up transistor (PU-2) 512 may each be the p-type MBC transistor 450P.

Based on the above discussions, the present disclosure offers advantages. It is understood, however, that other embodiments may offer additional advantages, and not all advantages are necessarily disclosed herein, and that no particular advantage is required for all embodiments. For example, the present disclosure provides an SRAM cell where the pass-gate transistors and pull-down transistors are implemented using n-type multi-threshold-voltage MBC transistors. Each of the n-type multi-threshold-voltage MBC transistors includes three or more sub-devices—a standard threshold voltage (SVt) n-type transistor, a low threshold voltage (LVt) n-type transistor, and an ultra-low threshold voltage (ULVt) n-type transistor. The low threshold voltage (LVt) n-type transistor and the ultra-low threshold voltage (ULVt) n-type transistor allows improved memory retention, reduce device dimensions due to simplified power supply circuits, improved (lowered) minimum supply voltage (Vccmin), and reduced power consumption.

The disclosure of the present disclosure provides embodiments of semiconductor devices and methods of forming the same. In one embodiment, a method is provided. The method includes forming a first channel member, a second channel member directly over the first channel member, and a third channel member directly over the second channel member, depositing a first metal layer around each of the first channel member, the second channel member, and the third channel member, removing the first metal layer from around the second channel member and the third channel member while the first channel member remains wrapped around by the first metal layer, after the removing of the first metal layer, depositing a second metal layer around the second channel member and the third channel member, removing the second metal layer from around the third channel member, and after the removing of the second metal layer, depositing a third metal layer around the third channel member.

In some embodiments, the first metal layer, the second metal layer and the third metal layer include aluminum (Al) and the first metal layer, the second metal layer and the third metal layer are different from one another in terms of aluminum content. In some embodiments, the first metal layer, the second metal layer and the third metal layer further include titanium (Ti). In some implementations, an aluminum to titanium (Al/Ti) ratio of the first metal layer is between about 0.3 and about 0.4, an aluminum to titanium (Al/Ti) ratio of the second metal layer is between about 0.5 and about 0.6, and an aluminum to titanium (Al/Ti) ratio of the third metal layer is between about 0.7 and about 0.8. In some embodiments, the removing of the first metal layer includes depositing a first pattern layer to cover the first metal layer around the first channel member, and selectively etching the first metal layer. In some instances, the selectively etching of the first metal layer includes use of phosphoric acid ($H_3PO_4$), nitric acid ($HNO_3$), acetic acid ($CH_3COOH$), or hydrofluoric acid (HF). In some embodiments, the removing of the second metal layer includes depositing a second pattern layer to cover the second metal layer around the second channel member, and selectively etching the second metal layer.

In another embodiment, a method is provided. The method includes forming a plurality of channel members that include a first channel member, a second channel member directly over the first channel member, and a third channel member directly over the second channel member, and forming a gate structure over the plurality of channel members, wherein the gate structure includes a first work function metal layer around the first channel member, a second work function metal layer around the second channel member, and a third work function metal layer around the third channel member. The first work function metal layer, the second work function metal layer, and the third work function metal layer are different from one another.

In some embodiments, the first work function metal layer, the second work function metal layer and the third work function metal layer include aluminum (Al) and the first work function metal layer, the second work function metal layer and the third work function metal layer are different from one another in terms of aluminum content. In some instances, the first work function metal layer, the second work function metal layer and the third work function metal layer further include titanium (Ti). In some embodiments, the first work function metal layer, the second work function metal layer and the third work function metal layer include lanthanum oxide. In some implementations, a first thickness of the first work function metal layer is greater than a second thickness of the second work function metal layer and the second thickness of the second work function metal layer is greater than a third thickness of the third work function metal layer. In some instances, the second thickness is about twice the third thickness. In some implementations, the first thickness is about three times the third thickness.

In a further embodiment, a semiconductor structure is provided. The semiconductor structure includes a first channel member, a second channel member disposed over the first channel member, a third channel member disposed over the second channel member, a first metal layer wrapping around the first channel member, a second metal layer wrapping around the second channel member, and a third metal layer wrapping around the third channel member. The first metal layer, the second metal layer, and the third metal layer include aluminum (Al) and the first metal layer, the second metal layer, and the third metal layer are different from one another in terms of aluminum content.

In some embodiments, a first aluminum content of the first metal layer is smaller than a second aluminum content of the second metal layer and the second aluminum content of the second metal layer is smaller than a third aluminum content of the third metal layer. In some implementations, the first metal layer, the second metal layer, and the third metal layer further include titanium (Ti). In some instances, an aluminum to titanium (Al/Ti) ratio of the first metal layer is between about 0.3 and about 0.4. In some embodiments, an aluminum to titanium (Al/Ti) ratio of the second metal layer is between about 0.5 and about 0.6. In some instances, an aluminum to titanium (Al/Ti) ratio of the third metal layer is between about 0.7 and about 0.8.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit-line conductor and word line conductor, one can achieve different resistances for the conductors. However, other techniques to vary the resistances of the metal conductors may also be utilized as well.

What is claimed is:

1. A semiconductor structure, comprising:
   a semiconductor substrate;
   a first nanostructure directly over the semiconductor substrate;
   a second nanostructure directly over the first nanostructure;
   a third nanostructure directly over the second nanostructure;
   a first dipole layer wrapping around each of the first nanostructure, the second nanostructure and the third nanostructure;
   a second dipole layer wrapping around each of the second nanostructure and the third nanostructure and disposed completely over the first nanostructure; and
   a third dipole layer wrapping around the third nanostructure and disposed completely above the second nanostructure,
   wherein the first dipole layer, the second dipole layer and the third dipole layer comprise lanthanum oxide.

2. The semiconductor structure of claim 1, wherein the semiconductor substrate, the first nanostructure, the second nanostructure, and the third nanostructure comprise silicon (Si).

3. The semiconductor structure of claim 1,
wherein a bottom surface of the second dipole layer is disposed over a top surface of the first dipole layer,
wherein a bottom surface of the third dipole layer is disposed over a top surface of the second dipole layer.

4. The semiconductor structure of claim 1, wherein the first dipole layer, the second dipole layer, and the third dipole layer are substantially similar in terms of composition and thickness.

5. The semiconductor structure of claim 4, wherein each of the first dipole layer, the second dipole layer, and the third dipole layer comprises a thickness between about 1.5 nm and about 2.5 nm.

6. The semiconductor structure of claim 1, wherein the second dipole layer is spaced apart from the second nanostructure by the first dipole layer.

7. The semiconductor structure of claim 1, wherein the third dipole layer is spaced apart from the third nanostructure by the first dipole layer and the second dipole layer.

8. The semiconductor structure of claim 1, further comprising:
a base fin disposed over the semiconductor substrate such that the first nanostructure is disposed over and spaced apart from the base fin; and
an isolation feature disposed over the semiconductor structure and surrounding the base fin,
wherein the first dipole layer is disposed over top surfaces of the base fin and the isolation feature.

9. A semiconductor structure, comprising:
a semiconductor substrate;
a bottom channel member disposed over the semiconductor substrate;
a middle channel member disposed directly over the bottom channel member;
a top channel member disposed directly over the middle channel member;
a first work function layer wrapping completely around only the bottom channel member;
a second work function layer wrapping completely around only the middle channel member; and
a third work function layer wrapping completely around only the top channel member,
wherein the first work function layer, the second work function layer, and the third work function layer are different in composition.

10. The semiconductor structure of claim 9,
wherein the first work function layer, the second work function layer, and the third work function layer comprise aluminum (Al),
wherein the first work function layer, the second work function layer, and the third work function layer are different from one another in terms of aluminum content.

11. The semiconductor structure of claim 10,
wherein a first aluminum content of the first work function layer is smaller than a second aluminum content of the second work function layer,
wherein the second aluminum content of the second work function layer is smaller than a third aluminum content of the third work function layer.

12. The semiconductor structure of claim 10, wherein the first work function layer, the second work function layer, and the third work function layer further comprise titanium (Ti).

13. The semiconductor structure of claim 12, wherein an aluminum to titanium (Al/Ti) ratio of the first work function layer is between about 0.3 and about 0.4.

14. The semiconductor structure of claim 12, wherein an aluminum to titanium (Al/Ti) ratio of the second work function layer is between about 0.5 and about 0.6.

15. The semiconductor structure of claim 12, wherein an aluminum to titanium (Al/Ti) ratio of the third work function layer is between about 0.7 and about 0.8.

16. A Static Random Access Memory (SRAM) cell, comprising:
a first pull-up transistor and a first pull-down transistor sharing a first gate structure;
a second pull-up transistor and a second pull-down transistor sharing a second gate structure;
a first pass-gate transistor; and
a second pass-gate transistor,
wherein each of the first pull-down transistor, the second pull-down transistor, the first pass-gate transistor, and the second pass-gate transistor comprises:
a semiconductor substrate,
a bottom channel member disposed over the semiconductor substrate,
a middle channel member disposed directly over the bottom channel member,
a top channel member disposed directly over the middle channel member,
a first work function layer wrapping completely around only the bottom channel member,
a second work function layer wrapping completely around only the middle channel member, and
a third work function layer wrapping completely around only the top channel member,
wherein the first work function layer, the second work function layer, and the third work function layer are different in composition,
wherein the bottom channel members, the middle channel members, and the top channel members of the first pass-gate transistor and the first pull-down transistor are aligned,
wherein the bottom channel members, the middle channel members, and the top channel members of the second pass-gate transistor and the second pull-down transistor are aligned.

17. The SRAM cell of claim 16,
wherein the first work function layer, the second work function layer, and the third work function layer comprise aluminum (Al),
wherein the first work function layer, the second work function layer, and the third work function layer are different from one another in terms of aluminum content.

18. The SRAM cell of claim 16,
wherein a first aluminum content of the first work function layer is smaller than a second aluminum content of the second work function layer,
wherein the second aluminum content of the second work function layer is smaller than a third aluminum content of the third work function layer.

19. The SRAM cell of claim 16, wherein the first work function layer, the second work function layer, and the third work function layer further comprise titanium (Ti).

20. The SRAM cell of claim 19,
wherein an aluminum to titanium (Al/Ti) ratio of the first work function layer is between about 0.3 and about 0.4, wherein an aluminum to titanium (Al/Ti) ratio of the second work function layer is between about 0.5 and about 0.6, wherein an aluminum to titanium (Al/Ti) ratio of the third work function layer is between about 0.7 and about 0.8.

* * * * *